(12) United States Patent
Perera et al.

(10) Patent No.: US 9,275,864 B2
(45) Date of Patent: Mar. 1, 2016

(54) METHOD TO FORM A POLYSILICON NANOCRYSTAL THIN FILM STORAGE BITCELL WITHIN A HIGH K METAL GATE PLATFORM TECHNOLOGY USING A GATE LAST PROCESS TO FORM TRANSISTOR GATES

(71) Applicant: Freescale Semiconductor, Inc., Austin, TX (US)

(72) Inventors: Asanga H Perera, West Lake Hills, TX (US); Sung-Taeg Kang, Austin, TX (US); Jane A Yater, Austin, TX (US); Cheong Min Hong, Austin, TX (US)

(73) Assignee: FREESCALE SEMICONDUCTOR,INC., Austin, TX (US)

( * ) Notice: Subject to any disclaimer, the term of this patent is extended or adjusted under 35 U.S.C. 154(b) by 260 days.

(21) Appl. No.: 13/973,433

(22) Filed: Aug. 22, 2013

(65) Prior Publication Data

US 2015/0054044 A1 Feb. 26, 2015

(51) Int. Cl.
| H01L 21/00 | (2006.01) |
| H01L 21/28 | (2006.01) |
| H01L 29/423 | (2006.01) |
| H01L 27/115 | (2006.01) |
| H01L 29/66 | (2006.01) |
| H01L 29/788 | (2006.01) |

(52) U.S. Cl.
CPC .... *H01L 21/28273* (2013.01); *H01L 27/11534* (2013.01); *H01L 29/42332* (2013.01); *H01L 29/66825* (2013.01); *H01L 29/7881* (2013.01)

(58) Field of Classification Search
CPC ............. H01L 21/28273; H01L 29/7881; H01L 29/66825
See application file for complete search history.

(56) References Cited

U.S. PATENT DOCUMENTS

| 5,614,746 | A | 3/1997 | Hong et al. |
| 6,087,225 | A | 7/2000 | Bronner et al. |
| 6,130,168 | A | 10/2000 | Chu et al. |
| 6,194,301 | B1 | 2/2001 | Radens et al. |
| 6,235,574 | B1 | 5/2001 | Tobben et al. |
| 6,333,223 | B1 | 12/2001 | Moriwaki et al. |
| 6,388,294 | B1 | 5/2002 | Radens et al. |
| 6,509,225 | B2 | 1/2003 | Moriwaki et al. |
| 6,531,734 | B1 | 3/2003 | Wu |

(Continued)

FOREIGN PATENT DOCUMENTS

| WO | 2009058486 | 5/2009 |
| WO | 2009058486 A1 | 5/2009 |

OTHER PUBLICATIONS

U.S. Appl. No. 13/442,142, Hall, M.D., et al., "Logic Transistor and Non-Volatile Memory Cell Integration", Office Action—Allowance, mailed Dec. 31, 2013.

(Continued)

*Primary Examiner* — Laura Menz

(57) ABSTRACT

A process integration is disclosed for fabricating non-volatile memory (NVM) cells (105-109, 113-115) on a first flash cell substrate area (111) which are encapsulated in one or more planar dielectric layers (116) prior to forming an elevated substrate (117) on a second CMOS transistor area (112) on which high-k metal gate electrodes (119-120, 122-126, 132, 134) are formed using a gate-last HKMG CMOS process flow without interfering with the operation or reliability of the NVM cells.

12 Claims, 14 Drawing Sheets

(56) References Cited

U.S. PATENT DOCUMENTS

| | | | |
|---|---|---|---|
| 6,635,526 | B1 | 10/2003 | Malik et al. |
| 6,707,079 | B2 | 3/2004 | Satoh et al. |
| 6,777,761 | B2 | 8/2004 | Clevenger et al. |
| 6,785,165 | B2 | 8/2004 | Kawahara et al. |
| 6,861,698 | B2 | 3/2005 | Wang |
| 6,939,767 | B2 | 9/2005 | Hoefler et al. |
| 7,154,779 | B2 | 12/2006 | Mokhlesi et al. |
| 7,183,159 | B2 | 2/2007 | Rao et al. |
| 7,190,022 | B2 | 3/2007 | Shum et al. |
| 7,202,524 | B2 | 4/2007 | Kim et al. |
| 7,208,793 | B2 | 4/2007 | Bhattacharyya |
| 7,223,650 | B2 * | 5/2007 | Chang ............... H01L 27/11 257/274 |
| 7,256,125 | B2 | 8/2007 | Yamada et al. |
| 7,271,050 | B2 | 9/2007 | Hill |
| 7,365,389 | B1 | 4/2008 | Jeon et al. |
| 7,391,075 | B2 | 6/2008 | Jeon et al. |
| 7,402,493 | B2 | 7/2008 | Oh et al. |
| 7,405,968 | B2 | 7/2008 | Mokhlesi et al. |
| 7,439,134 | B1 | 10/2008 | Prinz et al. |
| 7,476,582 | B2 | 1/2009 | Nakagawa et al. |
| 7,521,314 | B2 | 4/2009 | Jawarani et al. |
| 7,524,719 | B2 | 4/2009 | Steimle et al. |
| 7,544,490 | B2 | 6/2009 | Ferrari et al. |
| 7,544,980 | B2 | 6/2009 | Chindalore et al. |
| 7,544,990 | B2 | 6/2009 | Bhattacharyya |
| 7,560,767 | B2 | 7/2009 | Yasuda et al. |
| 7,745,344 | B2 | 6/2010 | Chindalore |
| 7,795,091 | B2 | 9/2010 | Winstead et al. |
| 7,799,650 | B2 | 9/2010 | Bo et al. |
| 7,816,727 | B2 | 10/2010 | Lai et al. |
| 7,821,055 | B2 | 10/2010 | Loiko et al. |
| 7,906,396 | B1 | 3/2011 | Chiang et al. |
| 7,932,146 | B2 | 4/2011 | Chen et al. |
| 7,989,871 | B2 | 8/2011 | Yasuda |
| 7,999,304 | B2 | 8/2011 | Ozawa et al. |
| 8,003,482 | B2 | 8/2011 | Brown |
| 8,017,991 | B2 | 9/2011 | Kim et al. |
| 8,043,951 | B2 | 10/2011 | Beugin et al. |
| 8,063,434 | B1 | 11/2011 | Polishchuk et al. |
| 8,093,128 | B2 | 1/2012 | Koutny et al. |
| 8,138,037 | B2 | 3/2012 | Chudzik et al. |
| 8,168,493 | B2 | 5/2012 | Kim |
| 8,173,505 | B2 | 5/2012 | Herrick et al. |
| 8,216,947 | B2 | 7/2012 | Lee |
| 8,298,885 | B2 | 10/2012 | Wei et al. |
| 8,334,198 | B2 | 12/2012 | Chen et al. |
| 8,372,699 | B2 | 2/2013 | Kang et al. |
| 8,389,365 | B2 | 3/2013 | Shroff et al. |
| 8,399,310 | B2 | 3/2013 | Shroff et al. |
| 8,524,557 | B1 | 9/2013 | Hall et al. |
| 8,536,006 | B2 | 9/2013 | Shroff et al. |
| 8,536,007 | B2 | 9/2013 | Shroff et al. |
| 8,679,927 | B2 | 3/2014 | Ramkumar et al. |
| 8,685,847 | B2 * | 4/2014 | Majumdar ........ H01L 29/66545 257/347 |
| 8,871,598 | B1 * | 10/2014 | Perera ............... H01L 29/665 257/E21.422 |
| 8,877,585 | B1 * | 11/2014 | Perera ............ H01L 21/28273 257/E21.422 |
| 8,901,632 | B1 * | 12/2014 | Perera ............... H01L 29/7831 257/314 |
| 8,932,925 | B1 * | 1/2015 | Hong ............... H01L 29/66181 438/261 |
| 8,937,011 | B2 | 1/2015 | Iuchi |
| 8,969,206 | B1 | 3/2015 | Sel |
| 8,969,940 | B1 * | 3/2015 | Yater ............... H01L 29/42328 257/314 |
| 9,006,093 | B2 * | 4/2015 | Hong ............... H01L 29/66833 257/316 |
| 9,082,837 | B2 * | 7/2015 | Perera ............... H01L 29/78 |
| 9,112,056 | B1 | 8/2015 | Shroff |
| 9,129,855 | B2 * | 9/2015 | Perera ............... H01L 29/42332 |
| 9,129,996 | B2 * | 9/2015 | Baker, Jr. ......... H01L 29/66833 |
| 9,136,129 | B2 * | 9/2015 | Perera ............ H01L 21/28273 |
| 9,136,360 | B1 * | 9/2015 | Perera ............ H01L 29/66833 |
| 2001/0049166 | A1 | 12/2001 | Peschiaroli et al. |
| 2002/0061616 | A1 | 5/2002 | Kim et al. |
| 2003/0022434 | A1 | 1/2003 | Taniguchi et al. |
| 2004/0075133 | A1 | 4/2004 | Nakagawa et al. |
| 2004/0188753 | A1 | 9/2004 | Kawashima et al. |
| 2004/0262670 | A1 | 12/2004 | Takebuchi et al. |
| 2005/0145949 | A1 | 7/2005 | Sadra et al. |
| 2005/0247962 | A1 * | 11/2005 | Bhattacharyya ........ G11C 11/39 257/237 |
| 2006/0038240 | A1 | 2/2006 | Tsutsumi et al. |
| 2006/0046449 | A1 | 3/2006 | Liaw |
| 2006/0099798 | A1 | 5/2006 | Nakagawa |
| 2006/0134864 | A1 | 6/2006 | Higashitani et al. |
| 2006/0211206 | A1 | 9/2006 | Rao et al. |
| 2006/0221688 | A1 | 10/2006 | Shukuri et al. |
| 2007/0037343 | A1 | 2/2007 | Colombo et al. |
| 2007/0077705 | A1 | 4/2007 | Prinz et al. |
| 2007/0115725 | A1 | 5/2007 | Pham et al. |
| 2007/0215917 | A1 | 9/2007 | Taniguchi |
| 2007/0224772 | A1 | 9/2007 | Hall et al. |
| 2007/0249129 | A1 | 10/2007 | Hall et al. |
| 2007/0264776 | A1 | 11/2007 | Dong et al. |
| 2008/0029805 | A1 | 2/2008 | Shimamoto et al. |
| 2008/0050875 | A1 | 2/2008 | Moon et al. |
| 2008/0067599 | A1 | 3/2008 | Tsutsumi et al. |
| 2008/0105945 | A1 | 5/2008 | Steimle et al. |
| 2008/0121983 | A1 | 5/2008 | Seong et al. |
| 2008/0128785 | A1 | 6/2008 | Park et al. |
| 2008/0145985 | A1 | 6/2008 | Chi |
| 2008/0185635 | A1 | 8/2008 | Yanagi et al. |
| 2008/0237690 | A1 | 10/2008 | Anezaki et al. |
| 2008/0237700 | A1 | 10/2008 | Kim et al. |
| 2008/0283900 | A1 | 11/2008 | Nakagawa et al. |
| 2008/0290385 | A1 | 11/2008 | Urushido |
| 2008/0308876 | A1 | 12/2008 | Lee et al. |
| 2009/0050955 | A1 | 2/2009 | Akita et al. |
| 2009/0065845 | A1 | 3/2009 | Kim et al. |
| 2009/0072274 | A1 | 3/2009 | Knoefler et al. |
| 2009/0078986 | A1 | 3/2009 | Bach |
| 2009/0101961 | A1 | 4/2009 | He et al. |
| 2009/0111229 | A1 | 4/2009 | Steimle et al. |
| 2009/0179283 | A1 | 7/2009 | Adams et al. |
| 2009/0225602 | A1 | 9/2009 | Sandhu et al. |
| 2009/0256211 | A1 | 10/2009 | Booth, Jr. et al. |
| 2009/0263749 | A1 | 10/2009 | Sim |
| 2009/0269893 | A1 | 10/2009 | Hashimoto et al. |
| 2009/0273013 | A1 | 11/2009 | Winstead et al. |
| 2009/0278187 | A1 | 11/2009 | Toba |
| 2011/0031548 | A1 | 2/2011 | White et al. |
| 2011/0095348 | A1 | 4/2011 | Chakihara et al. |
| 2011/0204450 | A1 | 8/2011 | Moriya |
| 2011/0260258 | A1 | 10/2011 | Zhu et al. |
| 2012/0034751 | A1 | 2/2012 | Ariyoshi et al. |
| 2012/0104483 | A1 | 5/2012 | Shroff et al. |
| 2012/0104498 | A1 * | 5/2012 | Majumdar ........ H01L 29/66545 257/351 |
| 2012/0132978 | A1 | 5/2012 | Toba et al. |
| 2012/0142153 | A1 | 6/2012 | Jeong |
| 2012/0248523 | A1 | 10/2012 | Shroff et al. |
| 2012/0252171 | A1 | 10/2012 | Shroff et al. |
| 2013/0026553 | A1 | 1/2013 | Horch |
| 2013/0037886 | A1 | 2/2013 | Tsai et al. |
| 2013/0065366 | A1 | 3/2013 | Thomas et al. |
| 2013/0084684 | A1 | 4/2013 | Ishii et al. |
| 2013/0137227 | A1 | 5/2013 | Shroff et al. |
| 2013/0171785 | A1 | 7/2013 | Shroff et al. |
| 2013/0171786 | A1 | 7/2013 | Shroff et al. |
| 2013/0178027 | A1 | 7/2013 | Hall et al. |
| 2013/0178054 | A1 | 7/2013 | Shroff et al. |
| 2013/0264633 | A1 | 10/2013 | Hall et al. |
| 2013/0264634 | A1 | 10/2013 | Hall et al. |
| 2013/0267072 | A1 | 10/2013 | Hall et al. |
| 2013/0267074 | A1 | 10/2013 | Hall et al. |
| 2013/0323922 | A1 | 12/2013 | Shen et al. |
| 2014/0035027 | A1 | 2/2014 | Chakihara et al. |
| 2014/0050029 | A1 | 2/2014 | Kang et al. |
| 2014/0120713 | A1 | 5/2014 | Shroff et al. |
| 2014/0227843 | A1 | 8/2014 | Tsukamoto et al. |

(56) References Cited

U.S. PATENT DOCUMENTS

| | | | | |
|---|---|---|---|---|
| 2015/0041875 A1* | 2/2015 | Perera | ..................... | H01L 29/78 257/314 |
| 2015/0054044 A1* | 2/2015 | Perera | ............... | H01L 21/28273 257/314 |
| 2015/0054049 A1* | 2/2015 | Perera | ............... | H01L 21/28273 257/316 |
| 2015/0054050 A1* | 2/2015 | Perera | ............... | H01L 21/28273 257/316 |
| 2015/0091079 A1* | 4/2015 | Perera | ............... | H01L 29/42332 257/326 |
| 2015/0093864 A1* | 4/2015 | Perera | ............... | H01L 21/28273 438/257 |

OTHER PUBLICATIONS

U.S. Appl. No. 13/781,727, Shroff, M., et al., "Methods of Making Logic Transistors and non-Volatile Memory Cells", Office Action—Allowance, mailed Jan. 31, 2014.

U.S. Appl. No. 13/928,666, Hong, Office Action—Rejection, mailed Jul. 23, 2014.

U.S. Appl. No. 14/041,662, Perera, Office Action—Restriction, mailed Aug. 1, 2014.

U.S. Appl. No. 13/969,180, Perera, Office Action—Allowance, mailed Aug. 5, 2014.

U.S. Appl. No. 13/781,727, Shroff, Office Action—Allowance, mailed Aug. 15, 2014.

U.S. Appl. No. 13/955,665, Office Action—Allowance, mailed Aug. 20, 2014.

U.S. Appl. No. 13/973,549, Hong, Office Action—Restriction, mailed Aug. 26, 2014.

U.S. Appl. No. 13/441,426, Shroff, Office Action—Allowance, mailed Sep. 26, 2014.

U.S. Appl. No. 13/661,157, Office Action—Restriction, mailed Oct. 2, 2014.

U.S. Appl. No. 13/343,331, Office Action—Allowance, mailed Nov. 8, 2013.

U.S. Appl. No. 14/041,662, Perera, Office Action—Allowance, mailed Oct. 17, 2014.

Office Action mailed Dec. 5, 2014 for U.S. Appl. No. 13/971,987, 5 pages.

Notice of Allowance mailed Jan. 22, 2015 for U.S. Appl. No. 13/790,004, 11 pages.

Office Action mailed Feb. 12, 2015 for U.S. Appl. No. 13/971,987, 7 pages.

Office Action mailed Dec. 4, 2014 for U.S. Appl. No. 13/972,372, 5 pages.

Office Action mailed Dec. 5, 2014 for U.S. Appl. No. 13/962,338, 7 pages.

U.S. Appl. No. 14/291,359, filed May 30, 2014, entitled Split Gate Nanocrystal Memory Integration.

U.S. Appl. No. 13/442,142, Hall, M.D., et al., "Logic Transistor and Non-Volatile Memory Cell Integration", Office Action—Allowance, Feb. 28, 2014.

U.S. Appl. No. 13/790,014, Hall, M., et al., "Integrating Formation of a Logic Transistor and a Non-Volatile Memory Cell Using a Partial Replacement Gate Technique", Office Action—Allowance, mailed Mar. 3, 2014.

U.S. Appl. No. 13/491,771, Hall et al., Integrating Formation of a Replacement Gate Transistor and a Non-Volatile Memory Cell Using a High-K Dielectric, Office Action—Allowance, mailed Mar. 6, 2014.

U.S. Appl. No. 13/907,491, Hall et al., "Logic Transistor and Non-Volatile Memory Cell Integration", Office Action—Allowance, mailed Mar. 11, 2014.

U.S. Appl. No. 13/790,225, Hall et al., "Integrating Formation of a Replacement Gate Transistor and a Non-Volatile Memory Cell Having Thin Film Storage", Office Action—Allowance, mailed Mar. 12, 2014.

U.S. Appl. No. 13/442,142, Office Action—Allowance, mailed Feb. 28, 2014.

U.S. Appl. No. 13/790,014, Office Action—Allowance, mailed Mar. 3, 2014.

U.S. Appl. No. 13/491,771, Office Action—Allowance, mailed Mar. 6, 2014.

U.S. Appl. No. 13/907,491, Office Action—Allowance, mailed Mar. 11, 2014.

U.S. Appl. No. 13/790,225, Office Action—Allowance, mailed Mar. 12, 2014.

U.S. Appl. No. 13/781,727, Office Action—Allowance, mailed May 12, 2014.

Notice of Allowance mailed Aug. 4, 2015 for U.S. Appl. No. 13/972,372, 8 pages.

U.S. Appl. No. 13/441,426, Shroff, M. D., et al., Office Action—Allowance, mailed Jun. 9, 2014.

Non-Final Office Action mailed Sep. 16, 2015 for U.S. Appl. No. 14/291,359, 7 pages.

Chen, J.H., et al., "Nonvolatile Flash Memory Device Using Ge Nanocrystals Embedded in HfA10 High-k Tunneling and Control Oxides: Device Fabrication and Electrical Performance", IEEE Transactions on Electron Devices, vol. 51, No. 11, Nov. 2004, pp. 1840-1848.

Kang, T.K., et al., "Improved characteristics for Pd nanocrystal memory with stacked HfAlO—SiO2 tunnel layer", Sciencedirect. com, Solid-State Electronics, vol. 61, Issue 1, Jul. 2011, pp. 100-105, http://wwww.sciencedirect.com/science/article/pii/S0038110111000803.

Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1. 4, pp. 634-637.

Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.

Liu, Z., et al., "Metal Nanocrystal Memories—Part I: Device Design and Fabrication", IEEE Transactions on Electron Devices, vol. 49, No. 9, Sep. 2002, pp. 1606-1613.

Mao, P., et al., "Nonvolatile memory devices with high density ruthenium nanocrystals", Applied Physics Letters, vol. 93, Issue 24, Electronic Transport and Semiconductors, 2006.

Mao, P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.

Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.

Wang, X.P., et al., Dual Metal Gates with Band-Edge Work Functions on Novel HfLaO High-K Gate Dielectric, IEEE, Symposium on VLSI Technology Digest of Technical Papers, 2006.

U.S. Appl. No. 13/402,426, Hall, M.D., et al., "Non-Volatile Memory Cell and Logic Transistor Integration", Office Action—Allowance—May 3, 2013.

U.S. Appl. No. 13/789,971, Hall, M.D., et al, "Integration Technique Using Thermal Oxide Select Gate Dielectric for Select Gate and Replacement Gate for Logic", Office Action—Allowance—May 15, 2013.

U.S. Appl. No. 13/491,771, Hall et al , "Integrating Formation of a Replacement Ggate Transistor and a Non-Volatile Memory Cell Using a High-K Dielectric", Office Action—Rejection, Sep. 9, 2013.

U.S. Appl. No. 13/442,142, Hall, M.D., et al., "Logic Transistor and Non-Volatile Memory Cell Integration", Office Action—*Ex Parte Quayle*, Apr. 4, 2013.

U.S. Appl. No. 13/442,142, Hall, M.D., et al., "Logic Transistor and Non-Volatile Memory Cell Integration", Office Action—Allowance, Aug. 2, 2013.

U.S. Appl. No. 13/907,491, Hall, M.D., et al., "Logic Transistor and Non-Volatile Memory Cell Integration", Office Action—Rejection, Sep. 13, 2013.

(56) References Cited

OTHER PUBLICATIONS

U.S. Appl. No. 12/915,726, Shroff, M., et al., "Non-Volatile Memory and Logic Circuit Process Integration", Office Action—Restriction, Jul. 31, 2012.
U.S. Appl. No. 12/915,726, Shroff, M., et al., "Non-Volatile Memory and Logic Circuit Process Integration", Office Action—Allowance, Dec. 10, 2012.
U.S. Appl. No. 13/781,727, Shroff, M., et al., "Methods of Making Logic Transistors and non-Volatile Memory Cells", Office Action—Rejection, Aug. 22, 2013.
U.S. Appl. No. 13/077,491, Shroff, M.., et al., "Non-Volatile Memory and Logic Circuit Process Integration", Office Action—Rejection, Aug. 15, 2012.
U.S. Appl. No. 13/077,491, Shroff, M.., et al., "Non-Volatile Memory and Logic Circuit Process Integration", Office Action—Rejection, Feb. 6, 2013.
U.S. Appl. No. 13/077,491, Shroff, M.., et al., "Non-Volatile Memory and Logic Circuit Process Integration", Office Action—Allowance, Jun. 18, 2013.
U.S. Appl. No. 13/077,501, Shroff, M.., et al., "Non-Volatile Memory and Logic Circuit Process Integration", Office Action—Allowance, Nov. 26, 2012.
U.S. Appl. No. 13/313,179, Shroff, M., et al., "Method of Protecting Against Via Failure and Structure Therefor", Office Action—Rejection, Aug. 15, 2013.
U.S. Appl. No. 13/307,719, Shroff, M., et al., "Logic and Non-Volatile Memory (NVM) Integration", Office Action—Allowance, May 29, 2013.
U.S. Appl. No. 13/343,331, Shroff, M., et al., "Non-Volatile Memory (NVM) and Logic Integration", Office Action—Rejection, Mar. 13, 2013.
U.S. Appl. No. 13/343,331, Shroff, M., et al., "Non-Volatile Memory (NVM) and Logic Integration", Office Action—Allowance, Jun. 24, 2013.
U.S. Appl. No. 13/441,426, Shroff, M., et al., "Non-Volatile Memory (NVM) and Logic Integration", Office Action—Allowance, Sep. 9, 2013.
U.S. Appl. No. 13/780,574, Hall, M.D., et al., Non-Volatile Memory (NVM) and Logic Integration, Office Action—Allowance, Sep. 6, 2013.
U.S. Appl. No. 13/491,760, Shroff, M.., et al., "Integrating Formation of a Replacement Gate Transistor and a Non-Volatile Memory Cell Using an Interlayer Dielectric", Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/790,225, Hall, M., et al., "Integrating Formation of a Replacement Gate Transistor and a non-Volatile Memory Cell Having Thin Film Storage", filed Mar. 8, 2013.
U.S. Appl. No. 13/790,014, Hall, M., et al., "Integrating Formation of a Logic Transistor and a None-Volatile Memory Cell Using a Partial Replacement Gate Technique", filed Mar. 8, 2013.
U.S. Appl. No. 13/955,665, Perera, A.H., "Non-Volatile Memory (NVM) and High K and Metal Gate Integration Using Gate First Methodology", filed Jul. 31, 2013.
U.S. Appl. No. 13/971,987, Perera, A.H., et al., "Integrated Split Gate Non-Volatile Memory Cell and Logic Structure", filed Aug. 21, 2013.
U.S. Appl. No. 13/972,372, Perera, A.H., et al., "Integrated Split Gate Non-Volatile Memory Cell and Logic Device", filed Aug. 21, 2013.
U.S. Appl. No. 13/962,338, Perera, A.H., "Nonvolatile Memory Bitcell With Inlaid High K Metal Select Gate", filed Aug. 8, 2013.
U.S. Appl. No. 13/928,666, Hong, C. M., et al., "Non-Volatile Memory (NVM) and High Voltage Transistor Integration", filed Jun. 27, 2013.
U.S. Appl. No. 14/023,440, Baker, F.K., Jr., et al., "Non-Volatile Memory (NVM) Cell and High-K and Metal Gate Transistor Integration", filed Sep. 10, 2013.
U.S. Appl. No. 13/969,180, Perera, A.H., et al., "Non-Volatile Memory (NVM) Cell, High Voltage Transistor, and High-K and Metal Gate Transistor Integration", filed Aug. 16, 2013.
U.S. Appl. No. 13/973,549, Hong, C.M., et al., "Split-Gate non-Volatile Memory (NVM) Cell and Device Structure Integration", filed Aug. 22, 2013.
U.S. Appl. No. 13/780,591, Hall, M.D., et al., "Non-Volatile Memory (NVM) and Logic Integration", filed Feb. 28, 2013.
U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/661,157, Shroff, M.D., et al., "Method of Making a Logic Transistor and a Non-Volatile Memory (NVM) Cell", filed Oct. 26, 2012.
U.S. Appl. No. 13/780,591, Hall, M., et al., "Non-Volatile Memory (NVM) and Logic Integration", Office Action—Allowance, mailed Nov. 22, 2013.
U.S. Appl. No. 13/790,225, Hall, M., et al., "Integrating Formation of a Replacement Gate Transistor and a Non-Volatile Memory Cell Having Thin Film Storage", Office Action—Allowance, mailed Dec. 24, 2013.
U.S. Appl. No. 13/790,014, Hall, M., et al., "Integrating Formation of a Logic Transistor and a Non-Volatile Memory Cell Using a Partial Replacement Gate Technique", Office Action—Allowance, mailed Dec. 24, 2013.
U.S. Appl. No. 13/780,574, Hall, M., et al., "Non-Volatile Memory (NVM) and Logic Integration", Office Action—Allowance, mailed Dec. 24, 2013.
U.S. Appl. No. 13/491,771, Hall et al., Integrating Formation of a Replacement Gate Transistor and a Non-Volatile Memory Cell Using a High-K Dielectric, Office Action—Allowance, mailed Jan. 16, 2014.
U.S. Appl. No. 13/781,727, Shroff, M., et al., "Methods of Making Logic Transistors and non-Volatile Memory Cells", Office Action—Restriction, Jun. 21, 2013.
Office Action mailed Feb. 21, 2014 in U.S. Appl. No. 13/441,426.
Notice of Allowance mailed Mar. 30, 2015 for U.S. Appl. No. 13/790,004, 5 pages.
Notice of Allowance mailed Apr. 27, 2015 for U.S. Appl. No. 13/971,987, 12 pages.
First Action Interview Office Action mailed May 22, 105 for U.S. Appl. No. 13/972,372, 12 pages.
Notice of Allowance mailed May 13, 2014 for U.S. Appl. No. 13/962,338, 11 pages.
Restriction Requirement mailed May 14, 2015 for U.S. Appl. No. 14/291,359, 8 pages.
Notice of Allowance mailed Sep. 29, 2015 for U.S. Appl. No. 13/972,372, 9 pages.
Notice of Allowance mailed Jan. 14, 2016 in U.S. Appl. No. 14/291,359; 9 pages.

\* cited by examiner

METHOD TO FORM A POLYSILICON NANOCRYSTAL THIN FILM STORAGE BITCELL WITHIN A HIGH K METAL GATE PLATFORM TECHNOLOGY USING A GATE LAST PROCESS TO FORM TRANSISTOR GATES

BACKGROUND OF THE INVENTION

1. Field of the Invention

The present invention is directed in general to integrated circuit devices and methods for manufacturing same. In one aspect, the present invention relates to the fabrication of CMOS metal gate devices and non-volatile memory devices integrated on a single substrate or chip.

2. Description of the Related Art

Non-volatile memory devices, such as EEPROM and flash memory, are used in computers and other electronic devices to store data and/or programming instructions that can be electrically erased and reprogrammed and that must be saved when power is removed. Embedded non-volatile memory (NVM) has become increasingly important in applications ranging from data and code storage to circuit trimming and customization. By embedding a non-volatile memory in a CMOS device, a single chip device can be manufactured and configured for a variety of applications. While the introduction of novel gate stack materials for forming high-k metal gate stacks using gate last processes has improved device performance and reduced feature sizes for transistor devices, there are a number of integration options and challenges associated with the integration of such novel materials with existing polysilicon nanocrystal thin film storage bitcells. For example, as the dimensions of transistors decrease, the height of the conventional gate stacks used to form NVM bitcells has been reduced to prevent the "gate last" processing steps from damaging the NVM bitcell gates.

BRIEF DESCRIPTION OF THE DRAWINGS

The present invention may be understood, and its numerous objects, features and advantages obtained, when the following detailed description is considered in conjunction with the following drawings, in which.

Figure 1:
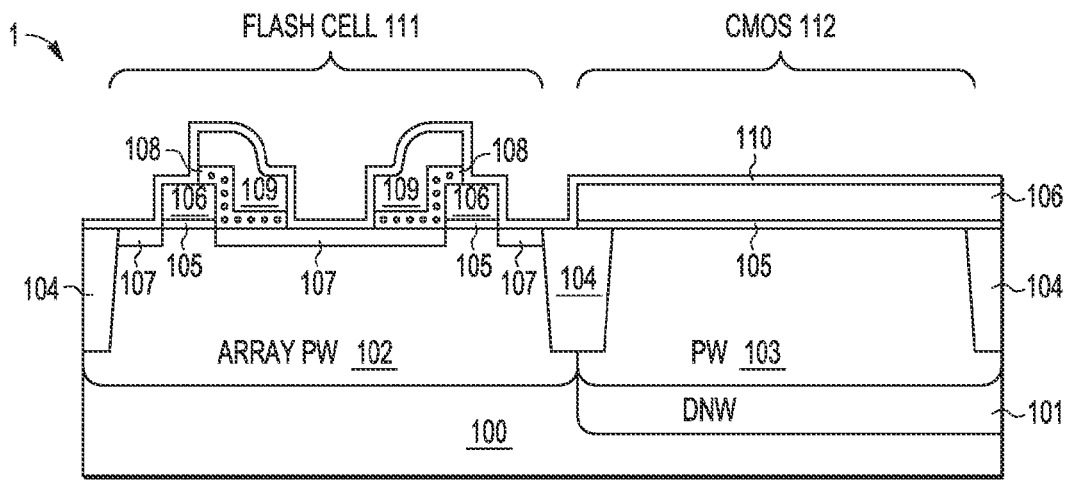
FIGS. 1-9 show a first example semiconductor device during successive phases of a fabrication sequence in which split-gate thin film storage non-volatile memory bitcells are fabricated before forming an elevated substrate area on which NMOS and PMOS high-k metal gate transistors are formed using a gate last process.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A compact split-gate polysilicon nanocrystal thin film storage (TFS) non-volatile memory (NVM) bitcell integrated with high-k metal gate (HKMG) transistors and associated fabrication process are disclosed in which selective epitaxial growth is used to elevate a wafer surface where HKMG transistors will be formed relative to the NVM bitcell to provide CMOS logic with on-chip non-volatile memory storage using a CMOS gate-last fabrication sequence, thereby enabling the co-existence of embedded flash and HKMG transistors on the same wafer. By encapsulating the NVM bitcell with a planar oxide layer prior to epitaxially growing or elevating the wafer surface in the HKMG transistor area, the NVM bitcell may be isolated from the metal gate processing and related metallic contamination used to form HKMG devices in the same gate last process flow. Selected embodiments of the disclosed integration scheme encapsulate polysilicon-nitrided-silicon dioxide ("poly-SiON") TFS bitcells in an NVM area with an oxide layer in which an opening is formed over non-NVM areas for epitaxially growing an elevated substrate on which is formed isolated high-k metal gate transistors using a gate last high-k metal gate platform technology process flow, thereby eliminating the formation and removal of NVM protection hard masks. In other embodiments of the disclosed integration scheme, split gate poly-SiON TFS NVM bitcells formed with spacer control gates are encapsulated with an oxide layer in which an opening is formed over non-NVM areas for epitaxially growing an elevated substrate on which isolated high-k metal gate transistors are formed using a gate last process. In yet other embodiments of the disclosed integration scheme, split gate poly-SiON TFS NVM bitcells are formed with polished and recessed control gates and encapsulated with an oxide layer, and an epitaxial substrate is formed through an opening in the oxide layer over the non-NVM areas on which high-k metal gate transistors are formed using a gate last process. In other embodiments of the disclosed integration scheme, split gate poly-SiON TFS NVM bitcells formed with inlaid control gates are encapsulated with an oxide layer in which an opening is formed over non-NVM areas for epitaxially growing an elevated substrate on which isolated high-k metal gate transistors are formed using a gate last process. In selected embodiments, the high-k metal gate transistors are formed by removing sacrificial poly gate electrodes formed over the elevated epitaxial substrate to leave or expose an underlying high-k gate dielectric layer that was previously formed, and then forming one or more metal gate layers on the exposed high-k gate dielectric layer. In other embodiments, the high-k metal gate electrodes are formed by removing the sacrificial poly gate electrodes and underlying (low-k) gate dielectric layer to expose the substrate, and then forming the high-k metal gate electrodes by depositing or forming high-k gate dielectric and metal gate layers.

In this disclosure, an improved system, apparatus, and fabrication method are described for fabricating embedded non-volatile memory devices on-chip with CMOS metal-gate transistors using a gate-last process that address various problems in the art where various limitations and disadvantages of conventional solutions and technologies will become apparent to one of skill in the art after reviewing the remainder of the present application with reference to the drawings and detailed description provided herein. For example, there are challenges with combining non-volatile memory (such as flash EEPROM) into a standard CMOS process flow, especially as CMOS technology is increasingly replacing silicon dioxide gate dielectrics and polysilicon gate conductors with high dielectric constant (high-k) dielectrics in combination with metal gate electrodes formed with one or more metal layers to form high-k metal gate (HKMG) electrode stacks. With some existing HKMG fabrication processes, there are challenges with integrating a poly-SiON split-gate TFS bitcell into a gate last technology that is used to form the HKMG electrodes. For example, in a gate-last process where wafer planarization is applied to expose transistors formed using a sacrificial polysilicon gate to implement an inlaid or damascene method of forming HKMG gates, non-volatile memory designs which use a double-high stack of poly-ONO (Oxide/Nitride/Oxide)-poly to form the charge storage elements (e.g., the floating gate of a MOSFET) would be destroyed during the wafer planarization step. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

FIG. 1 is a partial cross-sectional view of a first example semiconductor device or structure 1 formed on a substrate 100 which includes a flash memory cell area 111 and CMOS transistor area 112. Though the various structures, well, and layer regions are illustrated in simplified form with straight lines and curved or corner regions, it will be appreciated that the actual profile(s) for the different structures, well, and layer regions will not necessarily conform to simplified depictions, but will instead depend on the specific fabrication process(es) used. For example, the various well regions may have a curved junction profile reflecting the implantation and heating steps used in the formation of same. In addition, the depicted device structures may be formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++). As described below, one or more split-gate non-volatile memory bitcells (e.g., flash high voltage transistors and/or flash memory cells) may be formed in the flash memory cell area 111, such as by forming scaled polysilicon-nitrided-silicon dioxide (poly-SiON) TFS bitcells in the flash memory cell area 111. Subsequently, selective silicon epitaxial growth is used to elevate the substrate in CMOS transistor area 112 where a gate last process (a.k.a., a replacement gate method) is used to form one or more low voltage NMOS and PMOS transistors using a high-k dielectric metal gate (HKMG) technology in which the transistor gates are fabricated using a gate last or replacement gate method.

In the semiconductor structure 1, the depicted substrate 100 may be formed as a bulk semiconductor substrate or other substrate in which one or more additional semiconductor layers and/or well regions are formed using epitaxial semiconductor growth and/or selective doping techniques as described more fully hereinbelow. For example, the substrate 100 may be a semiconductor-on-insulator (SOI) type substrate which includes a semiconductor substrate, buried insulator layer formed over the substrate, and p-type semiconductor substrate layer formed over the buried insulator or oxide layer (not shown). Alternatively and depending on the type of transistor being fabricated, the semiconductor substrate 100 may be implemented as a bulk silicon substrate, single crystalline silicon (doped or undoped), SOI substrate, or any semiconductor material including, for example. Si, SiC, SiGe, SiGeC, Ge, GaAs, InAs, InP, as well as other III/V or II/VI compound semiconductors or any combination thereof.

In an upper portion of the substrate 100, a plurality of shallow trench isolation (STI) structures 104 are formed that divide the substrate 100 into separate regions, such as a flash memory cell area 111 and a CMOS device region 112. Thus, the STI structures 104 define lateral boundaries of different regions 111, 112, and may be formed using any desired technique, such as selectively etching an opening in the substrate 100 using a patterned mask or photoresist layer (not shown), depositing a dielectric layer (e.g., oxide) to fill the opening, and then polishing the deposited dielectric layer until planarized with the remaining substrate 100. Any remaining unetched portions of the patterned mask or photoresist layer (s) are stripped. As will be appreciated, the STI structures 104 may be formed in other ways in other embodiments.

In each of the defined regions 111, 112, upper portions of substrate 100 include active substrate layers 102, 103 between the STI regions 104 that may be doped differently, depending on whether the transistors formed in each area are n-type or p-type devices. For example, the active substrate layers in the CMOS region 112 where NMOS transistors are formed may be implanted with impurities of a first conductivity type (e.g., p-type impurities, such as boron) to form a p-well region 103, where the masking, implantation energy, dosage, and profile for the p-well region 103 are suitable for the formation of NMOS transistors. To isolate the active substrate layers in the CMOS region 112, the substrate 100 may also include a deep well region of a second, opposite polarity type formed under the p-well region 103, such as by selectively implanting or diffusing n-type impurities (e.g., arsenic or phosphorus) to form the deep n-well region 101, where the masking, implantation energy, dosage, and profile for the n-well region 101 are controlled to place the deep n-well region 101 below the p-well region 103. Though not shown, it will be appreciated that the polarity of the well regions 101, 103 may be reversed for the active substrate layers in the CMOS region 112 where PMOS transistors are formed, thereby forming an n-well region at an upper portion of substrate 100 (not shown), alone or in combination with an deep p-well region (not shown). In similar fashion, the active substrate layers in the flash cell device region 111 where n-type flash cells are formed may be implanted with p-type impurities to form an array well region 102 of a first conductivity type (e.g., p-well), where the masking, implantation energy, dosage, and profile for the p-well region 102 are suitable for the formation of NMOS flash cells. Again, the polarity of the array well region 102 may be reversed (e.g., to n-type) for the active substrate layers in the flash cell device region 111 where PMOS transistors are formed.

In the flash memory cell area 111 of the semiconductor structure 1, one or more split-gate polysilicon nanocrystal NVM bitcell structures may be formed with one or more poly gate layers using any desired processing steps, where the use of silicon nanocrystals as conductive islands encased in one or more dielectric layers (e.g., silicon oxide) may be referred to as a thin film storage NVM bitcell. By way of providing a non-limiting example of processing steps that may be used, one or more select gate dielectric layers 105 may be formed over the entirety of the substrate 100 and STI structures 104, such as by growing or depositing a gate dielectric layer of silicon dioxide or other suitable gate dielectric material to a predetermined gate dielectric thickness. On the gate dielectric layer(s) 105, one of more select gate conductor layers 106 may be formed, such as by blanket-depositing a layer of polysilicon or SiGe over the gate dielectric layer(s) 105 by using chemical vapor deposition (CVD), plasma-enhanced chemical vapor deposition (PECVD), physical vapor deposition (PVD), atomic layer deposition (ALD), or any combination(s) thereof to a thickness of approximately 500-2000 Angstroms, though a thinner or thicker layer may also be used. The select gate conductor layers 106 may be deposited as a doped poly layer, or may be subsequently doped with appropriate impurities to make the select gate layer 106 conductive. If desired, a gate cap layer may be formed or deposited to cover the conductive gate layer(s) 106, such as by forming an oxide layer, alone or in combination with an additional nitride/oxide layer stack. The conductive select gate layer(s) and underlying gate dielectric layers may be patterned and anisotropically etched to form the select gate electrode stacks 105, 106 for the TFS NVM bitcell structures in the flash cell device region 111, while leaving an unetched stack of gate conductor layer 106 and gate dielectric layer 105 over the CMOS region 112. As will be appreciated, any desired gate patterning and etch sequence may be used to form the patterned select gate electrode stacks, including but not limited to photoresist or a hard mask formation. TEOS etch (using the photoresist as a mask), ARC etch (using the remnant TEOS as a mask), pre-etch cleaning, oxide break through, main poly plasma etch, soft landing etch, poly clean overetch, and post-etch cleaning. As part of the select gate pattern etch sequence, the exposed select gate dielectric layer (s) 105 may also be cleared from the surface of the substrate 100.

Once the patterned select gate electrode stacks 105, 106 are formed and any etch mask layers are stripped or removed, one or more counter-doped control gate channel regions 107 may be formed in the array well 102 of the substrate 100 by implanting impurities around the select gate electrode stacks 105, 106 and any implant masks using conventional implanting processes to implant ions having a predetermined conductivity type. For example, if the flash cell area 111 is intended for N channel operation, the first doped region 107 is counter-doped with arsenic, phosphorous or another appropriate n-type dopant by selectively masking off the remainder of the substrate 100 from implantation. Conversely, if the flash cell 111 is intended for P channel operation, the first doped region 107 is lightly implanted with boron, indium or another appropriate p-type dopant by selectively masking off the remainder of the substrate 100 from implantation.

After counter-doping the control gate channel regions 107, a charge storage layer 108 of discrete storage elements is selectively formed over the substrate, including part of the top and side surface of the patterned select gate electrode stacks 105, 106 and the control gate channel region 107. In selected embodiments, the discrete storage elements are silicon nanocrystals. In other embodiments, the discrete storage elements may be made of other types of material such as, for example, polysilicon nanocrystals, silicon germanium nanocrystals, nanoclusters of a metal (e.g. gold, ruthenium, nickel, cobalt, tungsten), or nanoclusters of a silicide (e.g. cobalt silicide, nickel silicide). The discrete storage elements are used to selectively store charge introduced during a programming operation to selectively adjust a voltage threshold of a transistor depending upon whether a "1" or "0" value is to be stored in the memory cell. In selected embodiments, the charge storage layer 108 is formed as a nanocrystal stack, thereby forming a polysilicon-nitrided-silicon dioxide (poly-SiON) stack. While any desired nanocrystal stack formation sequence may be used, in selected example embodiments, the nanocrystal stack 108 may be formed by forming an insulating layer over the substrate 100 and patterned select gate electrode stacks 105, 106, such as by growing silicon oxide or other appropriate insulating layer to a predetermined thickness (e.g., approximately 40-100 Angstroms), though other materials or thicknesses may be used. On the insulating layer, a layer of nanocrystals may be formed, such as by depositing silicon nanocrystals having predetermined diameters (e.g., approximately 3-10 nanometers) and spacing (e.g., about 5 nanometers apart). After depositing the nanocrystals, an insulating layer is formed over and around the nanocrystals, such as by depositing an oxide with a low pressure chemical vapor deposition (LPCVD) high temperature oxide (HTO) to a predetermined thickness (e.g., approximately 100-150 Angstroms), though other materials or thicknesses may be used.

After forming the nanocrystal stack 108 over the substrate 100, one of more control gate conductor layers 109 may be formed, such as by blanket-depositing a layer of polysilicon or SiGe over the nanocrystal stack 108 by using CVD, PECVD, PVD, ALD, or any combination(s) thereof to a thickness of approximately 500-2000 Angstroms, though a thinner or thicker layer may also be used. The control gate conductor layers 109 may be deposited as a doped poly layer, or may be subsequently doped with appropriate impurities to make the control gate layer 109 conductive. If desired, a gate cap layer may be formed or deposited to cover the conductive control gate layers 109, such as by forming an oxide layer, alone or in combination with an additional nitride/oxide layer stack. The conductive control gate layer(s) 109 and underlying nanocrystal stack 108 may be patterned and anisotropically etched to form the control gate electrode stacks 108, 109 for the TFS NVM bitcell structures in the flash cell device region 111 using any desired control gate patterning and etch sequence, including but not limited to patterned photoresist in combination with one or more anisotropic etch processes. As depicted, the etch process(es) used to etch the control gate electrode stacks 108, 109 may be designed with a selective etch chemistry that leaves substantially intact the underlying select gate electrode stacks 105, 106. After the etch sequence for the patterned control gate/nanocrystal stack 108, 109 and removal of any patterned photoresist, the remaining polysilicon-nitrided-silicon dioxide stacks 106, 108, 109 form the split-gate electrodes in the flash memory cell device region. At this point, one or more dielectric layer(s) 110 may be formed over the substrate and remaining split-gate electrodes 106, 108, 109, such as by depositing or growing silicon oxide or another appropriate insulating layer to a predetermined thickness (e.g., approximately 15-100 Angstroms), though other materials or thicknesses may be used.

Figure 2:
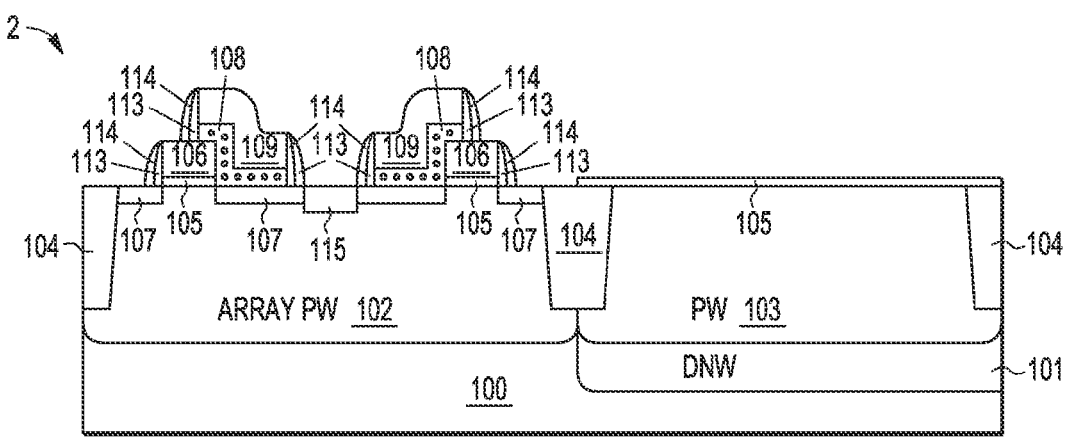

FIG. 2 illustrates processing of the semiconductor structure 2 subsequent to FIG. 1 after sidewall spacers and implanted source/drain substrate regions are formed around the remaining split-gate electrodes 106, 108, 109 and in the flash cell device region 111. While any desired source/drain implant sequence may be used, a first set of sidewall spacers 113 may be formed on the split-gate electrodes 106, 108, 109 as implant masks by forming a first dielectric layer (e.g., silicon dioxide or nitride) over the substrate 100 and/or anisotropically etching the dielectric layer(s) on the patterned split-gate electrodes 106, 108, 109 formed over the flash cell device region 111. Using the first set of sidewall spacers 113 and patterned split-gate electrodes 106, 108, 109 in combination with one or more patterned implant masks (not shown), halo or extension implant regions (not shown) may be formed by implanting appropriate polarity dopants, such as n-type halo/extension regions for n-type flash cell devices or p-type halo/extension regions for p-type flash cell devices. In addition, a second set of sidewall spacers 114 may subsequently be formed as implant masks by forming a second dielectric layer (e.g., silicon dioxide or nitride) over the substrate 100 which is then anisotropically etched to form sidewall spacers 114 adjacent to the first sidewall spacers 113. Using the second set of sidewall spacers 114 and patterned split-gate electrodes 106, 108, 109 in combination with one or more patterned implant masks (not shown), deep source/drain implant regions 115 may be formed by implanting appropriate polarity dopants, such as n-type source/drain regions 115 for n-type flash cell devices or p-type source/drain regions 115 for p-type flash cell devices. After implanting any halo/extension and/or source/drain regions in the flash cell device region 111, the dielectric layer(s) 110 and polysilicon layer 106 in the CMOS transistor area 112 may be removed, such as by forming a protective photoresist layer over the flash cell device region 111 and performing one or more etch steps to remove the dielectric layer 110 and poly layer 106 from the CMOS transistor area 112 while leaving the gate dielectric layer(s) 105 in place. To the extent that the foregoing spacer and implant processing steps have been applied to the CMOS transistor area 112, then any resulting device features formed in the CMOS transistor area 112 will be removed at this stage of the fabrication process.

Figure 3:
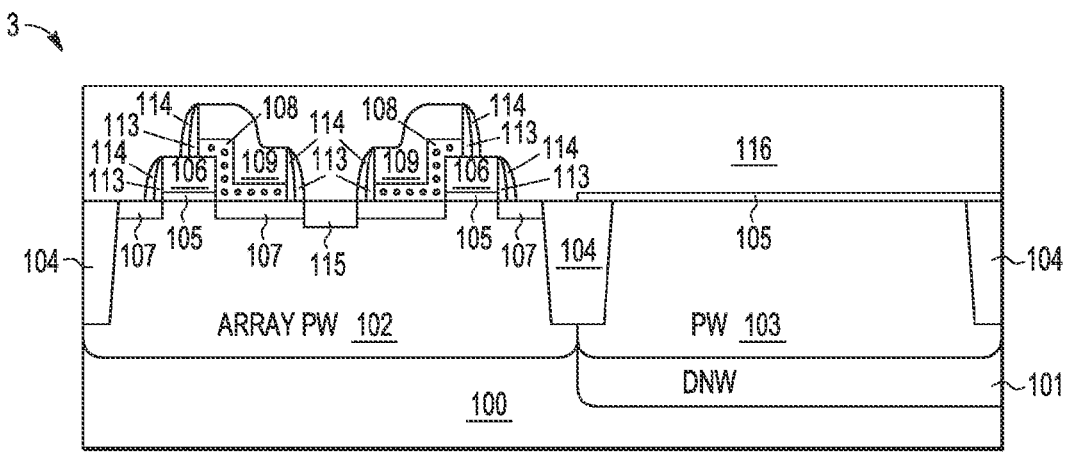

FIG. 3 illustrates processing of the semiconductor structure 3 subsequent to FIG. 2 after one or more planarized dielectric layers 116 are formed over the flash memory cell area 111 and CMOS transistor area 112. In selected embodiments, the planarized dielectric layer(s) 116 may form at least part of a first interlayer dielectric layer or stack that electrically isolates the device components formed on the substrate 100 from one another. For example, the planarized dielectric layers 116 may be formed with one or more dielectric pre-metal inter-level dielectric layers, including a deposited dielectric layer formed over the substrate 100 to a thickness of approximately 500-5000 Angstroms, though any thicknesses may be used that is sufficient to completely cover the split-gate electrodes 106, 108, 109 formed in the flash cell device region 111. In accordance with various embodiments, the planarized dielectric layer 116 is formed by depositing a conformal layer of silicon dioxide or other dielectric material using CVD, PECVD, PVD, ALD or any combination thereof. As deposited, the dielectric layer can be planarized to form the planarized dielectric layer(s) 116, alone or in combination with other dielectric layers, such as one or more gettering dielectric layers (e.g., a BPTEOS layer), sub-atmospheric tetra-ethyl ortho-silicate (SATEOS) layer(s), low-pressure TEOS (LPTEOS) CVD layer(s), plasma-enhanced TEOS (PETEOS) layer(s), and/or $SiO_xN_y$, atmospheric pressure TEOS (APTEOS) layer(s), HDP BPTEOS or HDP plasma enhanced PTEOS layer(s). At this point, the deposited dielectric layer is planarized using any desired planarization process, such as a planarization process that uses a chemical mechanical polish step to form a substantially planar surface on the planarized dielectric layer 116. However, the CMP polishing process is controlled to prevent exposure of the split-gate electrodes 106, 108, 109. As will be appreciated, the planarized dielectric layers 116 may be densified with one or more anneal process steps, though it will be appreciated that an anneal process may also be applied subsequently in the fabrication process.

Figure 4:
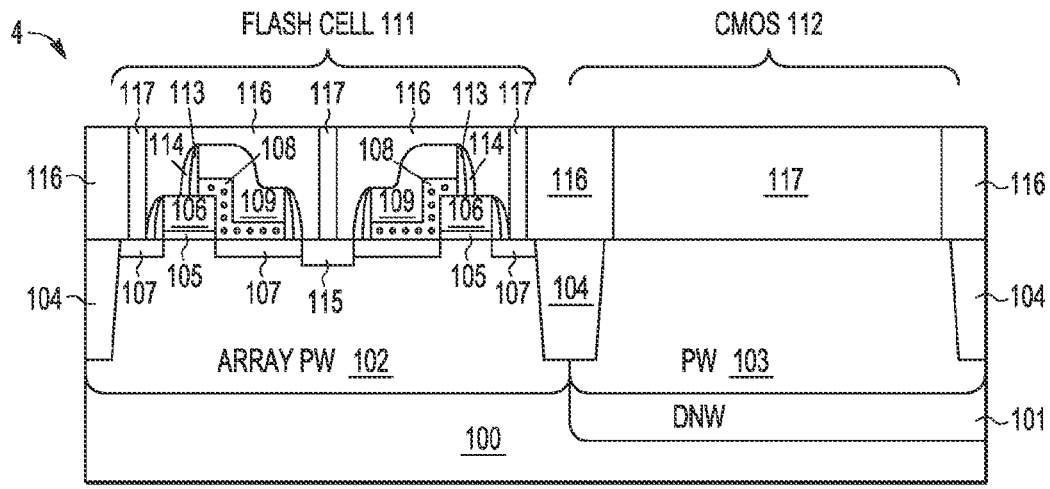

FIG. 4 illustrates processing of the semiconductor structure 4 subsequent to FIG. 3 after forming an elevated substrate 117 in the CMOS transistor area 112, alone or in combination with forming bitcell connection structures 117 in the flash memory cell area 111. As described herein, the elevated substrate 117 may be formed by using selective silicon epitaxial growth to elevate the substrate 117 where the 'logic' devices are formed, while simultaneously growing the bitcell connection structures 117 in the flash memory cell area 111. To form the elevated substrate 117 and bitcell connection structures 117, a patterned mask or photoresist layer (not shown) may be formed over the planarized dielectric layer 116 with openings aligned over the source/drain contact regions 115 in the flash memory cell area 111 and over the location for the elevated substrate in the CMOS transistor area 112. Using the patterned photoresist/mask layer, the planarized dielectric layer 116 is anisotropically etched to form openings which expose the source/drain contact regions 115 in the array substrate layer 102 and the location for the elevated substrate in the logic substrate layer 103. To the extent required, the etch process also removes any remaining gate dielectric layer 105 over the CMOS transistor area 112. In the openings, a semiconductor layer 117 may be selectively formed in the planarized dielectric layer 116. While any desired semiconductor formation process may be used, in selected embodiments, the semiconductor layer 117 is selectively formed using an epitaxial silicon growth process. For example, the semiconductor layer 117 may be selectively formed to a predetermined thickness (e.g., approximately 500-1000 Angstroms) to fill the patterned openings of the planarized dielectric layer 116 without also covering the planarized dielectric layer 116 by using a selective epitaxial growth of a silicon layer 117 which may be achieved by a process of chemical vapor deposition (CVD) at a chamber temperature between 400 and 900° C. in the presence of dichlorosilane, HCl, and hydrogen gas. As described herein and understood by those skilled in the art, the process of forming an epitaxial layers 117 may be described as growing an epitaxial layer, though sometimes the term "deposition" is loosely used to refer to the formation of the epitaxial layer. By selectively forming the epitaxial semiconductor layer 117 from the underlying substrate layers 102, 103, the semiconductor layer 117 has the same crystallographic orientation as the silicon substrate layers 102, 103. To remove any overgrowth of the epitaxial semiconductor layer 117, a planarization or CMP polish step may be applied to planarized the epitaxial semiconductor layer 117 with the planarized dielectric layer 116.

Figure 5:
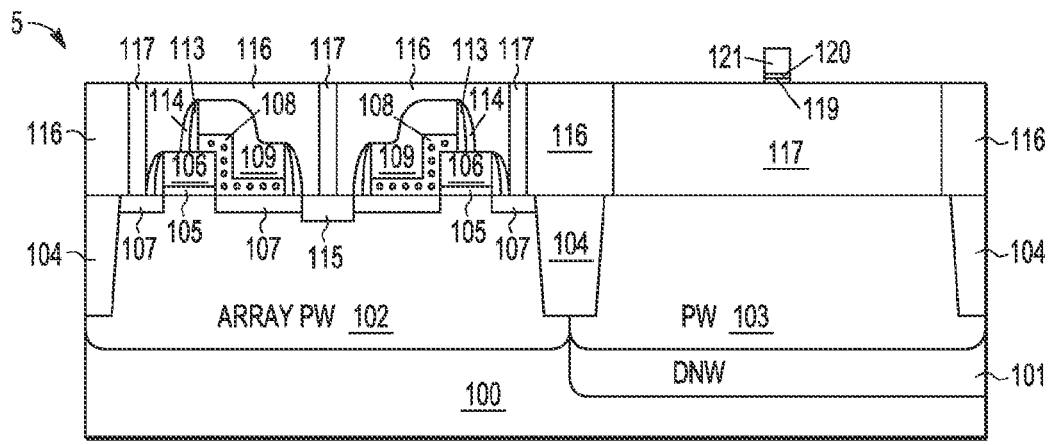

FIG. 5 illustrates processing of the semiconductor structure 5 subsequent to FIG. 4 after forming a sacrificial gate electrode 119-121 on the elevated substrate 117 in the CMOS transistor area 112. Prior to forming the sacrificial gate electrode 119-121, the elevated substrate 117 formed in the CMOS transistor area 112 may be selectively implanted with any required channel implants using appropriate implant masks and implantation steps to define the appropriate polarity implant regions, such as channel counter-doping or threshold voltage doping for any NMOS or PMOS low voltage transistors, dual gate transistors, high voltage transistors, or the like. After preparing the elevated substrate 117, one or more sacrificial transistor device structures (e.g., high voltage transistor gate electrodes, dual gate electrode structures, low voltage transistor gate electrodes, etc.) may be formed using one or more defined fabrication steps to define one or more poly gate layers on the elevated substrate 117. By way of providing a non-limiting example of processing steps that may be used, gate dielectric layer 119 may be formed over the elevated substrate 117, such as by growing or depositing a base dielectric layer of silicon dioxide or other suitable gate dielectric material to a predetermined gate dielectric thickness (e.g., approximately 5-15 Angstroms, though other materials or thicknesses may be used), followed by deposition of a high-k dielectric layer. The thickness(es) of base dielectric layer and the second high-k dielectric layer may be adjusted to realize a predetermined gate dielectric thickness for layer 119. In selected embodiments, the high-k dielectric layer contained within gate dielectric stack 119 may be formed by depositing a high-k gate dielectric material with a relatively high dielectric constant value on top of the base dielectric layer using CVD. PECVD, PVD, ALD, or any combination(s) of the above. In selected embodiments, the high-k dielectric layer contained within gate dielectric stack 119 may be formed by a low temperature CVD or ALD process to a predetermined final thickness in the range of 1-100 Angstroms (e.g. 15-25 Angstroms), though other thicknesses may be used. A suitable high-k gate dielectric material for the gate dielectric layer 119 is an insulator material having a dielectric constant value k of 7.0 or greater, including a hafnium-based dielectric such hafnium silicate (e.g., $Hf_xSi_{1-x}O_y$) or hafnium oxy-nitride (e.g., $Hf_xSi_{1-x}O_yN_z$), though other silicates of zirconium, aluminum, lanthanum, strontium, tantalum, titanium and combinations thereof may also be used, including but not limited to $HfSiO_X$, $ZrSiO_X$, $LaSiO_X$, $YSiO_X$, $ScSiO_X$, $CeSiO_X$, and $HfLaSiO_X$. In addition, multi-metallic oxides (for example barium strontium titanate, BST) may also provide high-k dielectric properties. A suitable temperature for the deposition process is in the range of approximately 200 degrees Celsius to approximately 400 degrees Celsius. On the gate dielectric layers 119, one of more patterned conductor layers 120 and 121 may be formed. In an example embodiment, the patterned conductor layer 120 is formed by depositing a first barrier metal layer over the gate dielectric layer 119, followed by blanket depositing a layer of polysilicon or SiGe to form conductor layer 121 over barrier metal layer 120 by CVD, PECVD, PVD, ALD, or any combination(s) thereof to a thickness of approximately 500-2000 Angstroms, though a thinner or thicker layer may also be used. After forming a patterned etch mask or photoresist layer (not shown), the conductive gate stack layers 120, 121 and underlying gate dielectric layers 119 may be anisotropically etched to form the sacrificial gate electrode 119-121 on the elevated substrate 117. As will be appreciated, any desired gate patterning and etch sequence may be used to form the patterned gate electrode stacks, including but not limited to photoresist or a hard mask formation, TEOS etch (using the photoresist as a mask), ARC etch (using the remnant TEOS as a mask), pre-etch cleaning, oxide break through, main poly plasma etch, soft landing etch, poly clean overetch, and post-etch cleaning. As part of the select gate pattern etch sequence, the exposed select gate dielectric layers 119, 120 may also be cleared from the surface of the epitaxial substrate 117.

Figure 6:
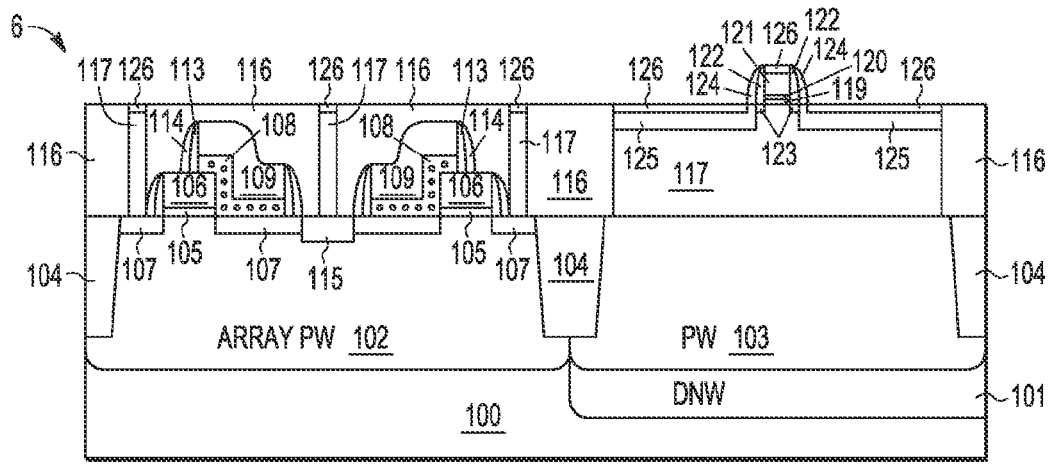

FIG. 6 illustrates processing of the semiconductor structure 6 subsequent to FIG. 5 after sidewall spacers and silicided source/drain substrate regions are formed around the sacrificial gate electrode 119-121 and in the CMOS transistor area 112. Through all or part of these processing steps, the flash cell device region 111 may be covered with a patterned mask layer to protect the bitcell connection structures 117 as required. While any desired source/drain implant sequence may be used in the CMOS transistor area 112, a first set of sidewall spacers 122 may be formed on the sacrificial gate electrode 119-121 as implant masks by forming a first dielectric layer (e.g., depositing silicon dioxide or nitride) which is then anisotropically etched to form the sidewall spacers 122 on sidewalls of the sacrificial gate electrode 119-121. Using the first set of sidewall spacers 122 and sacrificial gate electrode 119-121 in combination with one or more patterned implant masks (not shown), halo or extension implant regions 123 may be formed by implanting appropriate polarity dopants, such as n-type halo/extension regions for NMOS transistor devices or p-type halo/extension regions for PMOS transistor devices. In addition, a second set of sidewall spacers 124 may subsequently be formed as implant masks by forming a second dielectric layer (e.g., depositing silicon dioxide or nitride) which is then anisotropically etched to form sidewall spacers 124 adjacent to the first sidewall spacers 122. Using the second set of sidewall spacers 124 and sacrificial gate electrode 119-121 in combination with one or more patterned implant masks (not shown), deep source/drain implant regions 125 may be formed by implanting appropriate polarity dopants, such as n-type source/drain regions for NMOS transistor devices or p-type source/drain regions for PMOS transistor devices.

After implanting the source/drain regions 125 in the CMOS transistor area 112, self-aligned silicide regions 126 may be formed in the bitcell connection structures 117 in the flash memory cell area 111 and the exposed source/drain regions 125 in the CMOS transistor area 112. If desired, the patterned conductor layer 121 from the sacrificial gate electrode 119-121 may be exposed during the silicide formation process to also form a silicide region on the top of the sacrificial gate electrode 119-121. As will be appreciated, any desired silicide formation sequence may be used to form the silicide regions 126, including but not limited to forming a conductive or metal layer (e.g., cobalt or nickel) over at least the bitcell connection structures 117, source/drain regions 125, and patterned conductor layer 121 to a predetermined thickness (e.g., approximately 50-200 Angstroms) and then applying one or more thermal annealing steps to react the metal layer with the underlying elevated substrate and bitcell connection structures 117 (and sacrificial poly gate electrode 121) to form a silicide layer 126. In an example thermal anneal sequence, an initial rapid thermal anneal step (e.g. 400-600° C.) is applied, followed by a Piranha clean step to remove the metal from the exposed surfaces of the underlying semiconductor regions 117, 121, and then followed by a second rapid thermal anneal step (e.g., 650-850° C.), where the timing and temperature of the thermal anneal step(s) are selected so that the metal layer reacts with the exposed surfaces of the underlying semiconductor regions 117, 121, but not with the sidewall spacers 124 or the planarized dielectric layers 116.

Figure 7:
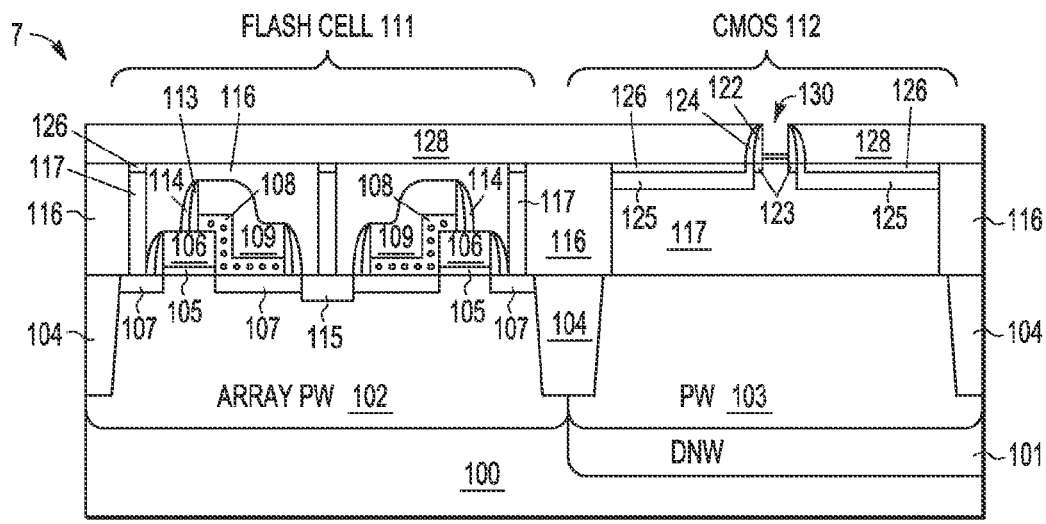

FIG. 7 illustrates processing of the semiconductor structure 7 subsequent to FIG. 6 after a planarized dielectric layer 128 is formed over the flash memory cell area 111 and CMOS transistor area 112, and at least a portion of the sacrificial gate electrode 119-121 is removed. In selected embodiments, the planarized dielectric layer 128 may be formed by depositing one or more planarized dielectric layers 128 over the flash memory cell area 111 and CMOS transistor area 112 to cover the planarized dielectric layers 116 and bitcell connection structures 117 while exposing the top of the sacrificial gate electrode 119-121. As part of a first interlayer dielectric stack, the planarized dielectric layer(s) 128 may be formed by depositing a dielectric layer using CVD, PECVD. PVD, or ALD to a predetermined thickness (e.g. approximately 500-5000 Angstroms) that is at least as thick as the height of the sacrificial gate electrode 119-121. In addition, the deposited dielectric layer 128 can be planarized using any desired planarization process, such as a chemical mechanical polish step, to form a substantially planar surface on the planarized dielectric layer 128. By using a timed CMP process, the planarized dielectric layers 128 expose the top of the sacrificial gate electrode 119-121. The CMP process may partially remove a portion of the sacrificial gate electrode 119-121, or may remove a minimal amount and leave these structures with substantially their original thickness. As will be appreciated, the planarized dielectric layers 128 may be densified with one or more anneal process steps, though it will be appreciated that an anneal process may also be applied subsequently in the fabrication process.

After forming the planarized dielectric layer 128, all or part of the sacrificial gate electrodes 119-121 may be removed to form gate electrode openings 130 in the CMOS transistor area 112 by applying one or more etch processes to remove the constituent layers of the sacrificial gate electrode 119-121. For example, a first poly etch process is applied to remove the exposed portions of the patterned gate poly layers 121, where the poly etch process is selective to the material (e.g. oxide) used to form the planarized dielectric layer 128 and the spacers 122. The removal of the exposed portions of the patterned poly layers 121 may use any desired poly etch process, including a dry etching process such as reactive-ion etching, ion beam etching, plasma etching or laser etching, a wet etching process wherein a chemical etchant is employed or any combination thereof. Once the exposed portions of the patterned poly layers 121 are removed, the resulting electrode openings 130 expose the previously formed gate dielectric layer 119 and barrier metal layer 120 which may be retained as part of the final CMOS area transistors. At this juncture as the metal gate formation processing begins, the presence of the planarized dielectric layer 128 over the flash memory cell area 111 eliminates any processing requirements for forming a patterned mask layer to protect the flash memory cell area 111 from the subsequent metal processing steps.

Though FIG. 7 shows that the gate dielectric layer 119 and barrier metal layer 120 are retained in the gate electrode openings 130, it will be appreciated that the previously formed gate dielectric layer 119 and barrier metal layer 120 may be removed and replaced with one or more subsequently formed gate dielectric layers. For example, one or more dielectric etch processes may be applied to remove the patterned gate dielectric layer 119 and barrier metal layer 120 and expose the underlying elevated substrate 117. Again, any desired dielectric etch process may be used, including a dry etching process such as reactive-ion etching, ion beam etching, plasma etching or laser etching, a wet etching process wherein a chemical etchant is employed or any combination thereof. In selected embodiments, a wet etch chemistry is applied briefly to remove the gate dielectric layer 119 and barrier metal layer 120, where the timing of the wet etch is controlled to minimize any etching of the planarized dielectric layer(s) 128 or spacers 122.

Figure 8:
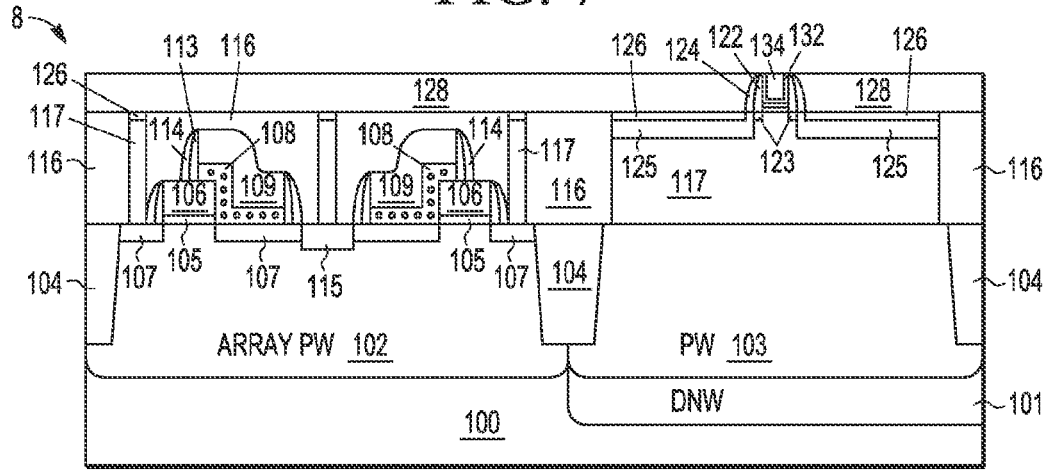

FIG. 8 illustrates processing of the semiconductor structure 8 subsequent to FIG. 7 after a replacement gate method is used to form metal gate electrodes 132, 134 on the previously formed high-k gate dielectric layer 119 and barrier metal layer 120 in the gate electrode openings 130. While the metal gate electrodes may be formed with any desired technique, in selected embodiments, one or more metal interface layers 132 may be formed on the bottom of the gate electrode openings 130, depending on the type of transistor (e.g., NMOS or PMOS) being formed. (In the event that the dielectric layer 119 and barrier metal layer 120 were removed from the gate electrode openings 130, then the appropriate gate dielectric layers would be formed prior to formation of any metal interface layer, such as by depositing or thermally growing an base oxide layer in the electrode openings 130, followed by deposition of an appropriate high-k gate dielectric layer to cover the base oxide layer.) As will be appreciated, the metal interface layer(s) 132 may be used to adjust the work function of the finally formed transistor, depending on its polarity type. In selected embodiments, the first metal interface layer 132 is selectively formed as a PFET work function metal layer on the barrier metal layer 120 in at least the gate electrode opening 130 used to form a PMOS transistor device, and is selectively formed as an NFET work function metal layer on the barrier metal layer 120 in at least the gate electrode opening 130 used to form a NMOS transistor device. This sequence can be implemented by depositing a first PFET metal interface layer in all exposed gate electrode openings 130 and over the planarized dielectric layer 128, followed by removing the first PFET metal interface layer from the NFET regions (e.g., with a patterned mask and etch process) and then depositing a second NFET metal interface layer in all exposed gate electrode openings 130. If desired, additional metal interface layers can be used, or alternatively, a single metal interface layer may be formed over PMOS and NMOS gate electrode openings 130 in the CMOS transistor area 112. In addition, the metal interface layers 132 may be deposited using any desired deposition or sputtering process, such as CVD, PECVD, PVD, ALD, molecular beam deposition (MBD) or any combination(s) thereof. A suitable material for use as the metal interface layers 132 is an element or alloy (e.g., TaC or W) which may be deposited to a predetermined thickness of 20-150 Angstroms (e.g., 50-100 Angstroms), though other metallic layer materials with different thicknesses may be used. In selected embodiments, the metal interface layers 132 may include an element selected from the group consisting of Ti, Ta, La, Ir, Mo, Ru, W, Os, Nb, Ti, V, Ni, W, and Re to form a metal or metal-based layer that may contain carbon and/or nitrogen (such as TiN, TaC, HfC, TaSi, ZrC, Hf, etc.) or even a conductive metal oxide (such as IrO$_2$).

On the metal interface layer(s) 132, one or more metal gate layers 134 are formed in the gate electrode openings 130. In selected embodiments, the metal gate layer 134 is formed with a conductive material, such as a metal or transition metal material including, as an example, aluminum or tungsten, that is formed using metal organic chemical vapor deposition (MOCVD), PVD, ALD, MBD, or any combination(s) thereof to a predetermined thickness in the range of 200-1000 Angstroms (e.g., 500-600 Angstroms), though other materials and thicknesses may be used. In other embodiments, the metal gate layer 134 is a doped silicon-containing gate layer 134 disposed over the metal interface layer(s) 132 to form a metal gate stack. In selected embodiments, the silicon-containing layer 134 is an amorphous or polysilicon cap layer or an amorphous/poly silicon germanium cap layer that is formed using CVD, PECVD, PVD. ALD. MBD, or any combination (s) thereof to a predetermined thickness in the range of 200-1000 Angstroms (e.g., 500-600 Angstroms), though other materials and thicknesses may be used. Silicon-containing gate layer 134 may also be a doped or undoped amorphous silicon or silicon germanium layer. However formed, the deposited metal interface and gate layers 132, 134 may then be planarized with one or more planarization steps to complete an inlaid or damascene fabrication sequence for forming the HKMG electrodes 132, 134 in the CMOS transistor area 112. While any desired planarization process may be used, in accordance with various embodiments, the semiconductor structure 8 may be planarized with one or more polish and/or etch processes, such as using a chemical mechanical polish step to planarize the upper portions of the planarized dielectric layer 128 and gate electrode structures 132, 134.

Figure 9:
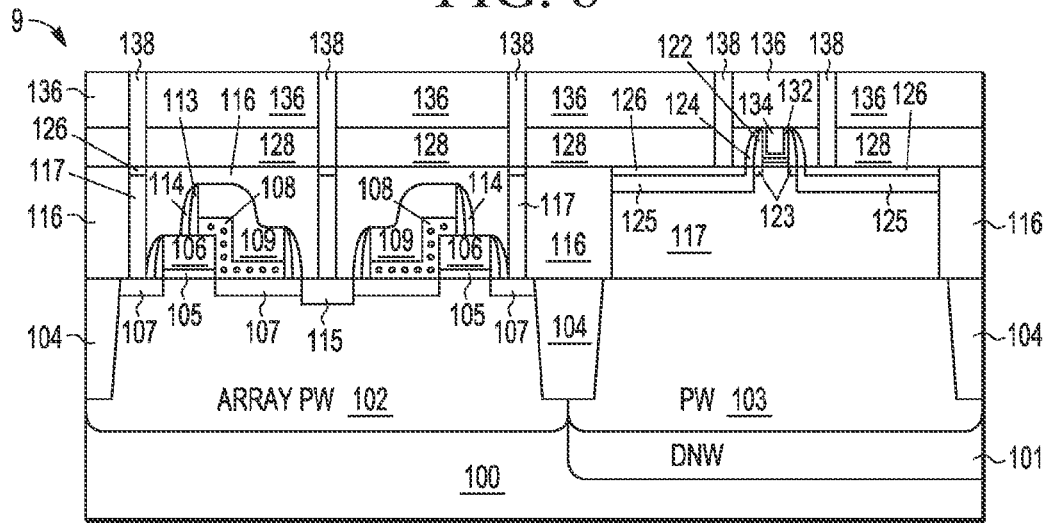

FIG. 9 illustrates processing of the semiconductor structure 9 subsequent to FIG. 8 after forming contacts 138 to the underlying flash memory cells and CMOS transistors through one or more planarized dielectric layers 136. While any desired sequence may be used to form the contacts 138, in selected example embodiments, one or more planarized dielectric layer(s) 136 may be formed over the planarized dielectric layer 128 by depositing a conformal layer of silicon dioxide or other pre-metal inter-level dielectric layer(s) using CVD, PECVD. PVD, ALD or any combination thereof to a predetermined thickness (e.g., approximately 500-5000 Angstroms), though other dielectric materials or thicknesses may be used. As deposited, the dielectric layer can be planarized to form the planarized dielectric layer(s) 136, alone or in combination with other dielectric layers. At this point, the deposited dielectric layer may be planarized using any desired planarization process, such as a planarization process that uses a chemical mechanical polish step to form a substantially planar surface on the planarized dielectric layer 136. In addition, the planarized dielectric layers 136 may be densified with one or more anneal process steps, though it will be appreciated that an anneal process may also be applied subsequently in the fabrication process. After forming the planarized dielectric layer 136, a patterned mask or photoresist layer (not shown) may be formed with openings aligned over the silicided bitcell connection structures 117, 126 in the flash memory cell area 111 and over the silicided source/drain contact regions 125, 126 in the CMOS transistor area 112 and over the metal gate electrodes 132, 134 (not shown). Using the patterned photoresist/mask layer, the planarized dielectric layers 128, 136 are anisotropically etched to form openings which expose the silicided bitcell connection structures 117, 126, the silicided source/drain contact regions 125, 126, and the metal gate electrodes 132, 134 (not shown). In the openings, conductive contact structures 138 are formed using any desired fabrication sequence, such as depositing one or more conductive layers to fill the openings, and then applying a CMP process to planarize the contacts 138 with the planarized dielectric layer 136.

As will be appreciated, additional processing steps may be used to complete the fabrication of the split-gate nonvolatile memory cells and NMOS/PMOS transistors. In addition to various front end processing steps (such as sacrificial oxide formation, stripping, isolation region formation, gate electrode formation, extension implant, halo implant, spacer formation, source/drain implant, annealing, silicide formation, and polishing steps), additional backend processing steps may be performed, such as forming contact openings, contact plugs and multiple levels of interconnect(s) that are used to connect the device components in a desired manner to achieve the desired functionality. Thus, the specific sequence of steps used to complete the fabrication of the device components may vary, depending on the process and/or design requirements.

Figure 10:
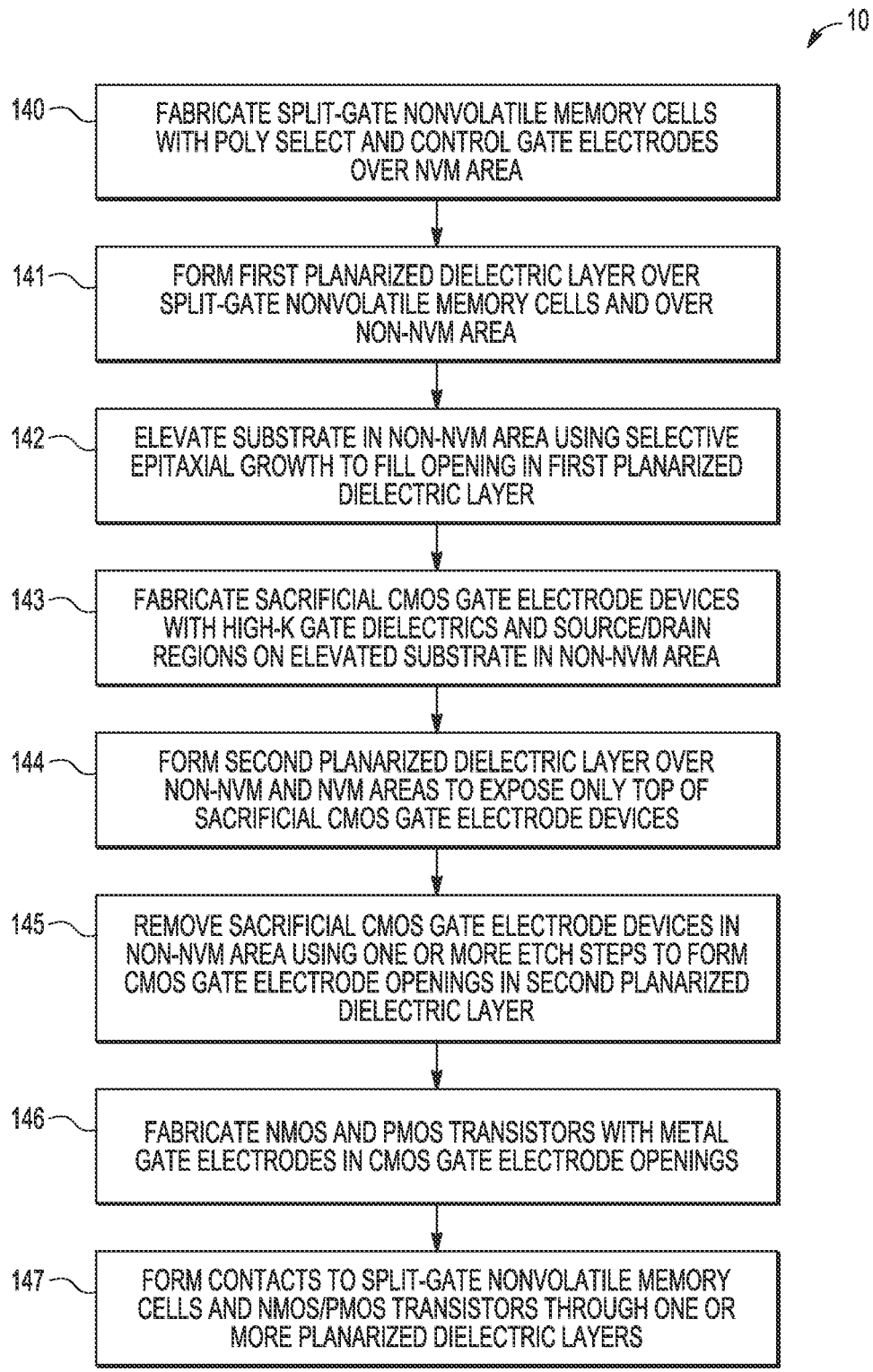
FIG. 10 illustrates an example process flow diagram of a fabrication sequence for integrating a split-gate NVM memory cells formed with poly gate electrodes into a replacement gate sequence for fabricating gate last high-k metal gate electrodes by using selective silicon epitaxial growth to elevate logic areas where the high-k metal gate electrodes are formed.

Turning now to FIG. 10, there is shown an example process flow diagram of a fabrication sequence 10 for integrating a split-gate NVM memory cells formed with poly gate electrodes into a replacement gate sequence for fabricating gate last high-k metal gate electrodes by using selective silicon epitaxial growth to elevate logic areas where the high-k metal gate electrodes are formed. As shown, the process begins at step 140 during the front end of line (FEOL) process for forming split-gate flash memory cells with one or more poly gate electrode layers. During the FEOL process, split-gate nonvolatile memory cells are fabricated with poly select and control gate electrodes over one or more non-volatile memory (NVM) areas at step 140. At this stage, split gate poly-SiON TFS NVM bitcells may be formed with poly select and control gates separated from one another by a charge-storing nanocrystal stack and defining source and drain regions in the underlying substrate.

Next, a first planarized dielectric layer is formed over the split-gate NVM cells and over the non-NVM area at step 141. For example, the first planarized dielectric layer may be formed by depositing a conformal layer or film of silicon oxide which is then polished to a flat or planarized surface which covers and protects the NVM area (and its split-gate NVM cells) and the non-NVM area.

At step 142, an openings is formed in first planarized dielectric layer over the non-NVM area, and an elevated substrate is formed in the non-NVM are by using selective epitaxial growth to fill the opening in first planarized dielectric layer. At this point, bitcell connections to the split-gate flash memory cells can be formed with the same epitaxial growth process used to form elevate the substrate in the non-NVM area.

At step 143, one or more sacrificial CMOS gate electrode devices and associated source/drain regions may be formed on the elevated substrate in the non-NVM area while protecting the split-gate NVM cells with the first planarized dielectric layer. In an example sequence, the sacrificial CMOS gate electrode devices are formed with a patterned conductive gate stack formed over a high-k gate dielectric layer, where one or more sidewall spacers formed on the patterned conductive gate stack are used to implant source/drain regions in the elevated substrate.

Next, a second planarized dielectric layer is formed over the non-NVM and NVM areas to expose only a top of the sacrificial CMOS gate electrode devices at step 144. For example, the second planarized dielectric layer may be formed by depositing a conformal layer or film of silicon oxide which is then polished to a flat or planarized surface which exposes at least the upper portions of the sacrificial CMOS gate electrode devices.

At step 145, the sacrificial CMOS gate electrode devices are selectively removed from the non-NVM areas using one or more etch steps to form CMOS gate electrode openings in the second planarized dielectric layer. For example, one or more poly etch steps may be applied to remove the upper poly layer in the sacrificial CMOS gate electrode devices, though one or more additional oxide etch steps may also be applied to remove the gate dielectric layers from the sacrificial CMOS gate electrode devices.

At step 146, NMOS and PMOS high-k metal gate electrodes are formed in the CMOS gate electrode openings in the second planarized dielectric layer. While different materials and processes may be used to form the constituent gate electrode layers for the NMOS and PMOS transistors, the NMOS and PMOS high-k metal gate electrodes may be formed by depositing and planarizing at least a first metal interface layer and metal-based gate electrode layer in the CMOS gate electrode openings.

At step 147, one or more contacts are formed to the split-gate nonvolatile memory cells and NMOS/PMOS transistors. In selected example embodiments, the contact are formed by first forming a third planarized dielectric layer over the non-NVM and NVM areas, forming contact openings through one or more planarized dielectric layers to the split-gate nonvolatile memory cells and NMOS/PMOS transistors, and then filling the contact openings with one or more conductive contact layers which may be planarized (e.g., with a CMP process).

As seen from above, the fabrication sequence 10 is described with reference to specified NVM and non-NVM areas where selective epitaxial silicon growth is used to elevate the non-NVM wafer surface where high-k metal gate logic devices are formed after encapsulating previously formed poly-SiON TFS bitcells in the NVM area with a planarized dielectric layer which isolates the NVM bitcell gates from the metal gate processing effects (e.g., metallic contamination), allowing poly-SiON NVM bitcells to be fabricated together with HKMG devices in the same gate last process flow. However, it will be appreciated that various benefits of the present disclosure may also be obtained from forming an elevated substrate in a specified device region area to protect another device region formed in a lower substrate area. In addition, it will be appreciated that other types of split-gate NVM bitcell devices may be formed with different sequencing and/or materials. For example, FIGS. 11-22 show a second example semiconductor device during successive phases of a fabrication sequence in which split-gate TFS NVM bitcells with spacer control gates are fabricated before using selective silicon epitaxial growth to elevate substrate areas where a gate last process is used to form NMOS and PMOS high-k metal gate transistors.

Figure 11:
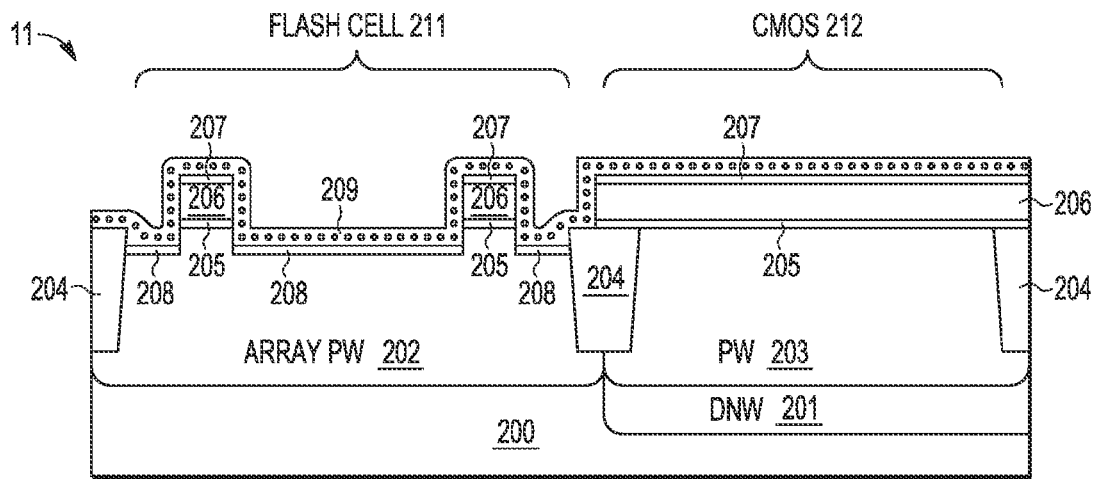
FIGS. 11-22 show a second example semiconductor device during successive phases of a fabrication sequence in which split-gate thin film storage non-volatile memory bitcells are fabricated before forming an elevated substrate area on which NMOS and PMOS high-k metal gate transistors are formed using a gate last process.

Starting with FIG. 11, there is shown a partial cross-sectional view of the second semiconductor device or structure 11 formed on a substrate 200 which includes an array substrate region 202 where flash memory cells are formed, and a logic substrate region 203 where CMOS transistors are formed. The depicted substrate 200 may be formed as a bulk semiconductor substrate formed with any semiconductor material (e.g., Si, SiC, SiGe, SiGeC, Ge, GaAs, InAs, InP, as well as other III/V or II/VI compound semiconductors or any combination thereof), a semiconductor-on-insulator (SOI) type substrate, or any desired substrate structure in which one or more semiconductor layers and/or well regions are formed. In an upper portion of the substrate 200, shallow trench isolation (STI) structures 204 are formed using any desire technique to divide the substrate 200 into separate isolated regions, such as an array substrate region 202 where flash memory cells are formed, and a logic substrate region 203 where CMOS transistors are formed. Though not shown, the upper well regions 202, 203 of the substrate 200 may include active substrate layers which are selectively doped, depending on whether the bitcells formed in the area are n-type or p-type devices. To isolate the active substrate layers in the logic substrate region 203, the substrate 200 may also include a deep well region 201 formed under the well region 203 having a second, opposite polarity type from the polarity of the well region 203.

In the array substrate region 202 of the semiconductor structure 11, one or more split-gate polysilicon nanocrystal TFS NVM bitcell structures may be formed with one or more poly gate layers using any desired processing steps. By way of providing a non-limiting example of processing steps that may be used, FIG. 11 shows that one or more patterned select gate electrodes 205-207 may be fabricated, followed by a recess etch of the exposed silicon surface where the control gate transistors will be fabricated. In an example fabrication sequence, the patterned select gate electrodes 205-207 may be formed by sequentially growing or depositing one or more gate dielectric layers 205 (e.g., silicon dioxide), one of more select gate conductor layers 206 (e.g., a doped poly layer), and one or more capping dielectric layers 207 (e.g., silicon dioxide or nitride) using thermal oxide growth, CVD, PECVD, PVD, ALD, or other suitable formation process to define a select gate electrode stack which is then patterned and anisotropically etched to form the select gate electrode stacks 205-207 for the TFS NVM bitcell structures, where the select gate etch process may include a substrate recess etch process (e.g., reactive ion etch process) that is controlled to over-etch into the array substrate region 202, thereby recessing the control gate channel areas, while leaving an unetched gate conductor stack 205-207 over the logic substrate region 203. After forming the patterned select gate electrodes 205-207 and recessed control gate channel areas and otherwise preparing the semiconductor structure 11 (e.g., with a surface repair oxidation step), one or more counter-doped control gate channel regions 208 may be formed in the recessed array substrate region 202 of the substrate 200 by implanting impurities around the select gate electrode stacks 205-207 and any implant masks using conventional implanting processes to implant ions having a predetermined conductivity type, depending on the device type being formed. In addition, a nanocrystal stack 209 may be formed over the semiconductor structure 11 using any desired nanocrystal stack formation sequence, such as by depositing one or more insulating layers in which silicon nanocrystals having predetermined diameters and spacing are formed, thereby forming a polysilicon-nitrided-silicon dioxide (poly-SiON) stack 206-207, 209. In other embodiments, other charge storage layers may be formed. The nanocrystal stack 209 may be formed as a conformal layer to cover the recessed control gate channel areas and the top and sides of the select gate electrode stacks 205-207 formed over the array and logic substrate regions 202, 203.

Figure 12:
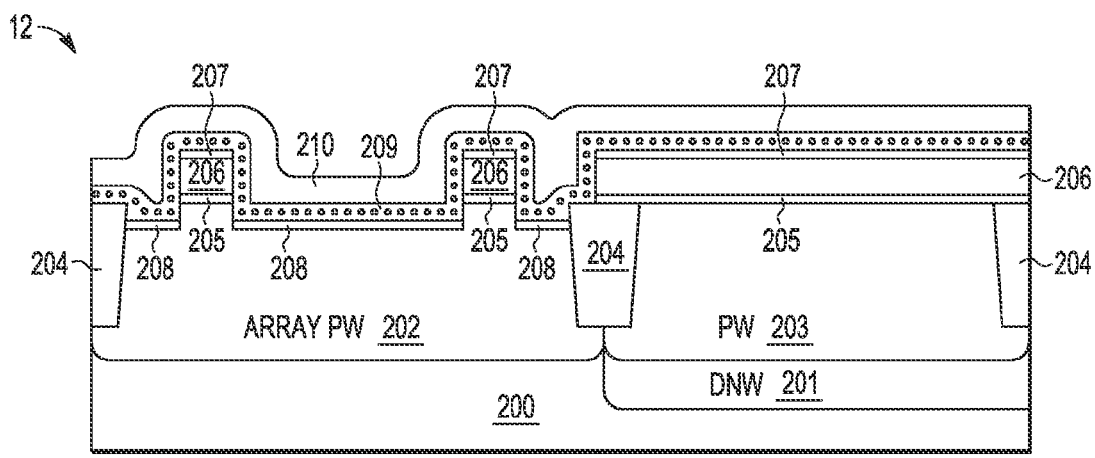

FIG. 12 illustrates processing of the semiconductor structure 12 subsequent to FIG. 11 after one of more control gate conductor layers 210 are formed over the nanocrystal stack 209, such as by blanket-depositing a layer of polysilicon or SiGe over the nanocrystal stack 209 by using CVD, PECVD, PVD, ALD, or any combination(s) thereof to a thickness of approximately 500-2000 Angstroms, though a thinner or thicker layer may also be used. The control gate conductor layers 210 may be deposited as a doped poly layer, or may be subsequently doped with appropriate impurities to make the control gate layer 210 conductive.

Figure 13:
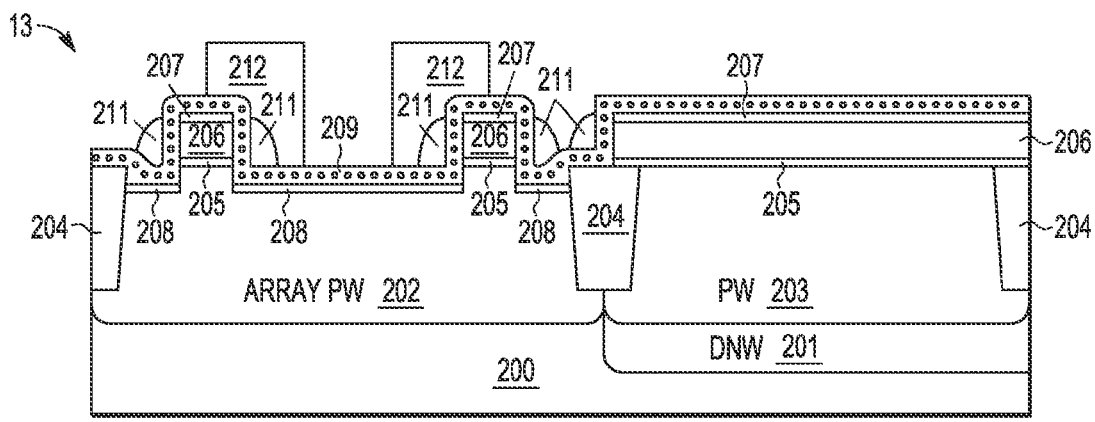

FIG. 13 illustrates processing of the semiconductor structure 13 subsequent to FIG. 12 after the control gate conductor layers 210 are etched to form sidewall spacer control gates 211. While any poly etch process may be used, a conductive control gate layer(s) 210 may be anisotropically etched with a selective etch chemistry to form the sidewall spacer control gates 211 on each side of the patterned select gate electrodes 205-207 without removing or substantially etching the underlying nanocrystal stack 209. After the control gate spacer etch sequence, a patterned photoresist layer or etch mask 212 is formed to cover selected spacer control gates 211 and portions of the nanocrystal stack 209, while substantially leaving unprotected the nanocrystal stack 209 formed over the logic substrate region 203 where CMOS transistors are subsequently formed.

Figure 14:
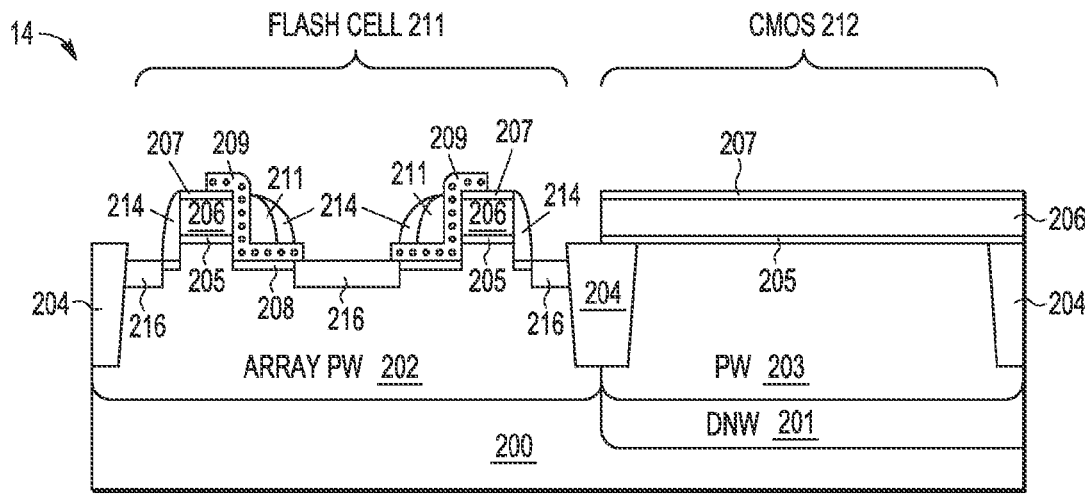

FIG. 14 illustrates processing of the semiconductor structure 14 subsequent to FIG. 13 after the patterned nanocrystal stack 209 and spacer control gates 211 are selectively etched to form split-gate electrodes around which implant spacers and source/drain implant regions are formed. In particular, the spacer control gate 211 and underlying nanocrystal stack 209 may be anisotropically etched with the patterned photoresist layer or etch mask 212 in place to form split-gate TFS NVM bitcell gate electrode structures 205-207, 209, 211 using any desired etch sequence, including but not limited to patterned photoresist in combination with one or more anisotropic etch processes. As depicted, the etch process(es) used to selectively etch the nanocrystal stack 209 and unprotected spacer control gates 211 may be designed with a selective etch chemistry that removes any unmasked portions of the nanocrystal stack 209 and unmasked spacer control gates 211, while leaving substantially intact the underlying select gate conductor layers 206 and capping dielectric layers 207. After the etch sequence and removal of any patterned photoresist 212, the remaining patterned split-gate TFS NVM bitcell gate electrode structures are used to form source/drain implant regions. For example, one or more sidewall spacers 214 may be formed on the split-gate TFS NVM bitcell gate electrode structures, such as by growing or depositing one or more dielectric layers (e.g., silicon dioxide or nitride) which is then anisotropically etched to form the one or more sidewall spacers 214. Using the one or more sidewall spacers 214 and patterned split-gate electrodes 205-207, 209, 211 in combination with one or more patterned implant masks (not shown), source/drain regions 216 may be formed by implanting appropriate polarity dopants, such as by implanting n-type or p-type halo or extension implant regions or deep N+/P+ source/drain regions. In other embodiments, the spacer and source/drain fabrication sequence may include formation of a first sidewall spacer for use in implanting bitcell source and drain halo implant regions, followed by formation of a second sidewall spacer adjacent to the first sidewall spacer for use in implanting deep source/drain regions.

Figure 15:
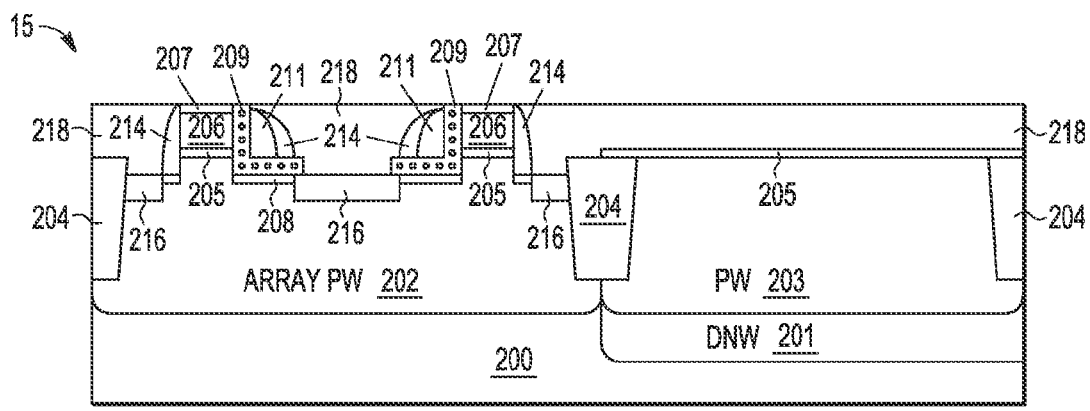

FIG. 15 illustrates processing of the semiconductor structure 15 subsequent to FIG. 14 after removing the select gate conductor layers 206 and capping dielectric layers 207 from above the logic substrate region 203 where CMOS transistors are formed and formation of a first planarized dielectric layer 218 to cover the array and logic substrate regions 202, 203. In selected example embodiments, the select gate conductor layers 206 and capping dielectric layers 207 over the logic substrate region 203 may be removed by forming a protective photoresist layer over the array substrate region 202 and performing one or more etch steps to remove the dielectric layer 207 and underlying poly layer 206 while leaving the gate dielectric layer(s) 205 in place. To the extent that the preceding spacer and implant processing steps have been applied over the logic substrate region 203, then any resulting device features formed over the logic substrate region 203 will be removed at this stage of the fabrication process. After removing the select gate conductor layers 206 and capping dielectric layers 207 from above the logic substrate region 203 and stripping any protective photoresist layer over the array substrate region 202, one or more first planarized dielectric layers 218 are formed over the semiconductor structure 15, such as by depositing a first interlayer dielectric layer or stack using CVD. PECVD, PVD, ALD or any combination thereof to a thickness that is at least as thick as the height of the split-gate electrodes 205-207. 209, 211. At this point, the deposited dielectric layer 218 may be planarized using any desired planarization process, such as a planarization process that uses a chemical mechanical polish step to form a substantially planar surface on the planarized dielectric layer 218. In addition, the CMP polishing process may be controlled expose only the capping dielectric layers 207 of the split-gate electrodes 205-207, 209, 211. If desired, the planarized dielectric layers 218 may be densified with one or more anneal process steps now or later in the process.

Figure 16:
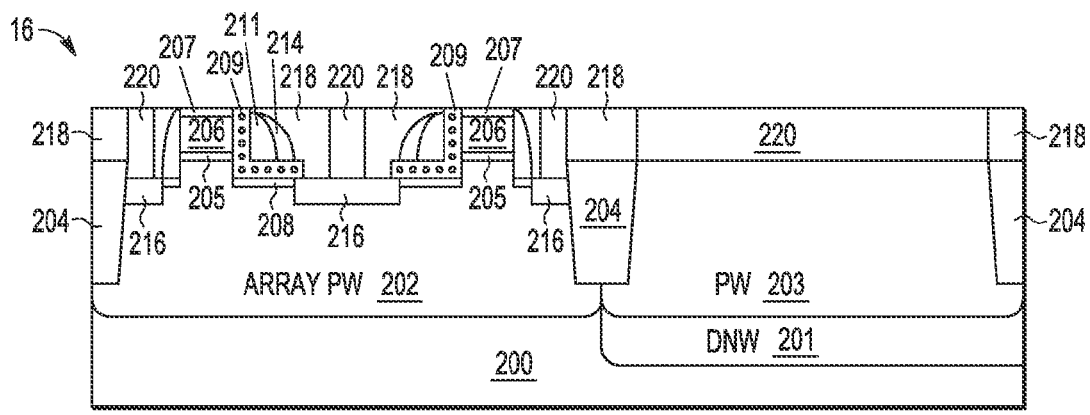

FIG. 16 illustrates processing of the semiconductor structure 16 subsequent to FIG. 15 after forming an elevated substrate 220 from the logic substrate region 203, alone or in combination with forming bitcell connection structures 220 from the array substrate region 202. As described herein, the elevated substrate 220 may be formed by using selective silicon epitaxial growth to elevate the logic substrate region 203 where the 'logic' devices are formed, while simultaneously growing the bitcell connection structures 220 in the array substrate region 202 where flash memory cells are formed. To form the elevated substrate 220 and bitcell connection structures 220, patterned openings are formed in the planarized dielectric layer 218 (e.g., with a patterned mask or photoresist layer and one or more anisotropic etch steps) in alignment with the source/drain contact regions 216 and over the logic substrate region 203. To the extent required, the etch process also removes any remaining gate dielectric layer 205 over the logic substrate region 203. After removing any patterned mask or photoresist layer, epitaxial layers 220 may be formed in the openings, such as by using a selective epitaxial silicon growth process to fill the openings in the planarized dielectric layer 218. In this way, the epitaxial layer 220 forms an elevated substrate which has the same crystallographic orientation as the underlying logic substrate region 203. In selected embodiments, the epitaxial grown process is controlled to form an epitaxial layer 220 having a thickness (e.g., approximately 500-1000 Angstroms) that is at least as thick as the height of the split-gate electrodes 205-207, 209, 211. To remove any overgrowth of the epitaxial semiconductor layer 220, a planarization or CMP polish step may be applied to planarize the epitaxial semiconductor layer 220 with the planarized dielectric layer 218.

Figure 17:
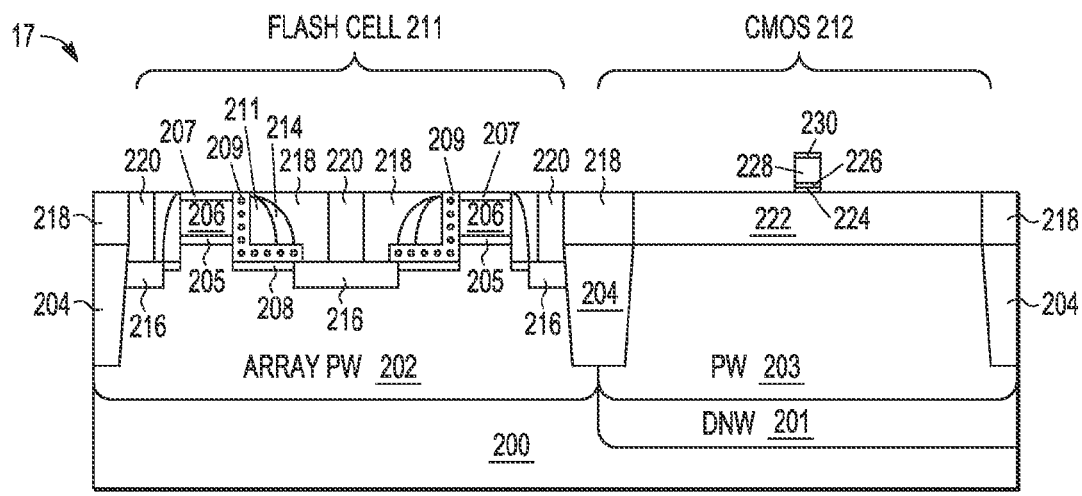

FIG. 17 illustrates processing of the semiconductor structure 17 subsequent to FIG. 16 after forming a sacrificial gate electrode 224, 226, 228 on the elevated substrate 220 formed from the logic substrate region 203. Prior to forming the sacrificial gate electrode, the elevated substrate 220 may be selectively implanted with any required channel implants using appropriate implant masks and implantation steps to define the appropriate polarity implant regions, such as channel counter-doping or threshold voltage doping for any NMOS or PMOS low voltage transistors, dual gate transistors, high voltage transistors, or the like. After preparing the elevated substrate 220, one or more sacrificial transistor device structures (e.g., high voltage transistor gate electrodes, dual gate electrode structures, low voltage transistor gate electrodes, etc.) may be formed using one or more defined fabrication steps to define one or more poly gate layers on the elevated substrate 220. By way of providing a non-limiting example of processing steps that may be used, one or more gate dielectric layers 224 may be formed over the elevated substrate 220, such as by growing or depositing a base dielectric layer (e.g., silicon dioxide or other suitable gate dielectric material) and a high-k dielectric layer 226 (e.g., $Hf_xSi_{1-x}O_y$) using CVD, PECVD, PVD, ALD, or any combination(s) of the above to a predetermined thickness. On the gate dielectric layers 224, the patterned conductor layers 226 and 228 may be formed, such as by depositing a first barrier metal layer 226 over the gate dielectric layers 224 and then blanket-depositing a layer of polysilicon or SiGe over the barrier metal layer by CVD, PECVD, PVD, ALD, or any combination(s) thereof to a predetermined thickness. After forming a patterned etch mask or photoresist layer 230, the conductive gate stack layers 226 and 228 and underlying gate dielectric layers 224 may be anisotropically etched to form the sacrificial gate electrode 224, 226, 228 on the elevated substrate 220. At this juncture, the planarized dielectric layer 218 in combination with the capping dielectric layers 207 protect and isolate the NVM bitcell gates from the gate electrode processing effects.

Figure 18:
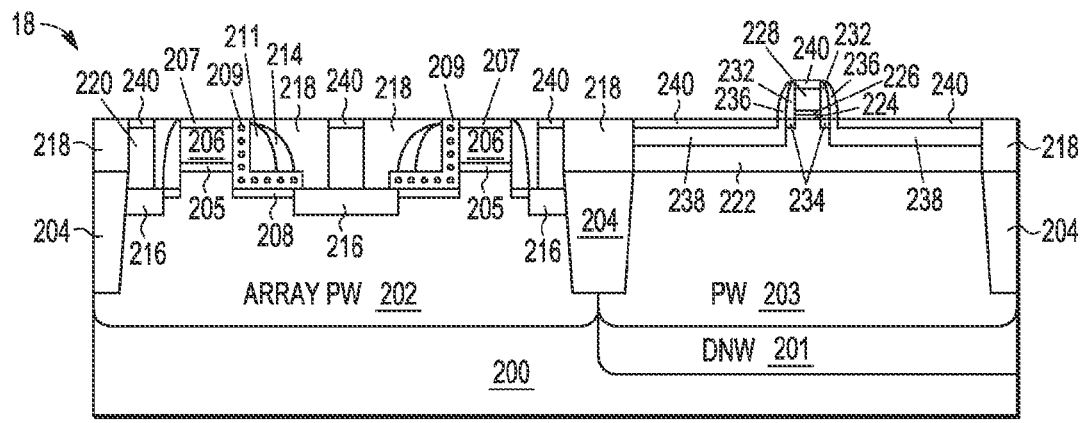

FIG. 18 illustrates processing of the semiconductor structure 18 subsequent to FIG. 17 after sidewall spacers and silicided source/drain substrate regions are formed around the sacrificial gate electrode 224, 226, 228 and in the elevated substrate 220. Through all or part of these processing steps, a patterned mask layer may be formed to protect the bitcell connection structures 220 formed over the array substrate region 202 if desired. While any desired source/drain implant sequence may be used to form the CMOS transistors above the logic substrate region 203, a first set of sidewall spacers 232 may be formed as implant masks by forming a first dielectric layer (e.g., depositing silicon dioxide or nitride) which is then anisotropically etched to form the sidewall spacers 232 on sidewalls of the sacrificial gate electrode 224, 226, 228 which are used in combination with one or more patterned implant masks (not shown) to form halo or extension implant regions 234 by implanting appropriate polarity dopants, such as n-type halo/extension regions for NMOS transistor devices or p-type halo/extension regions for PMOS transistor devices. In addition, a second set of sidewall spacers 236 may subsequently be formed as implant masks by forming a second dielectric layer (e.g., depositing silicon dioxide or nitride) which is then anisotropically etched to form sidewall spacers 236 adjacent to the first sidewall spacers 232. Using the second set of sidewall spacers 236 in combination with one or more patterned implant masks (not shown), deep source/drain implant regions 238 may be formed by implanting appropriate polarity dopants, such as n-type source/drain regions for NMOS transistor devices or p-type source/drain regions for PMOS transistor devices. Subsequently, self-aligned silicide regions 240 may be formed in the bitcell connection structures 220 and in the exposed source/drain regions 238, such as by depositing and thermally annealing conductive or metal layer (e.g., cobalt or nickel) to react with the exposed semiconductor layers to form the silicide layers 240.

Figure 19:
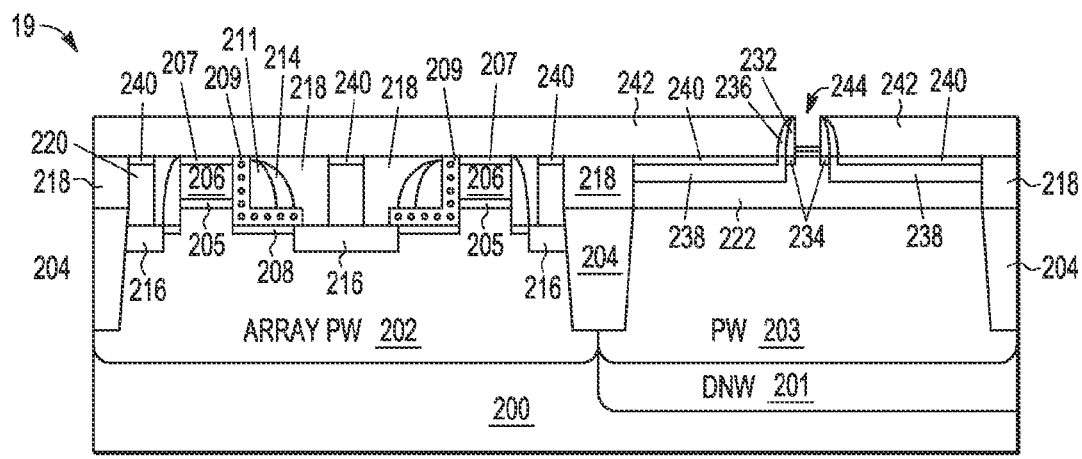

FIG. 19 illustrates processing of the semiconductor structure 19 subsequent to FIG. 18 after a planarized dielectric layer 242 is formed over the array and logic substrate regions 202, 203, and at least a portion of the sacrificial gate electrode 224, 226. 228 is removed. As described hereinabove, the planarized dielectric layer 242 may be formed as part of a first interlayer dielectric stack to cover the planarized dielectric layers 218 and bitcell connection structures 220 while exposing the top of the sacrificial gate electrode 224, 226, 228. As part of a first interlayer dielectric stack, the planarized dielectric layer(s) 242 may be formed by depositing a dielectric layer using CVD, PECVD. PVD, or ALD to a predetermined thickness that is at least as thick as the height of the sacrificial gate electrode 224, 226, 228, and may be planarized with a CMP step to form a substantially planar dielectric layer 242. By using a timed CMP process, the planarized dielectric layer 242 exposes the top of the sacrificial gate electrode 224, 226, 228, and may partially remove a portion of the sacrificial gate electrode. If desired, the planarized dielectric layers 242 may be densified with one or more anneal process steps at this point or later in the fabrication process. After forming the planarized dielectric layer 242, all or part of the sacrificial gate electrodes 224, 226, 228 may be removed to form CMOS gate electrode openings 244 by applying one or more etch processes to remove the constituent layers of the sacrificial gate electrode 224, 226, 228. At this juncture as the high-k metal gate formation processing begins, the presence of the planarized dielectric layer 242 over the split-gate electrodes 205-207, 209, 211 eliminates any processing requirements for forming a patterned mask layer to protect the poly control and select gates from the subsequent metal processing steps.

Figure 20:
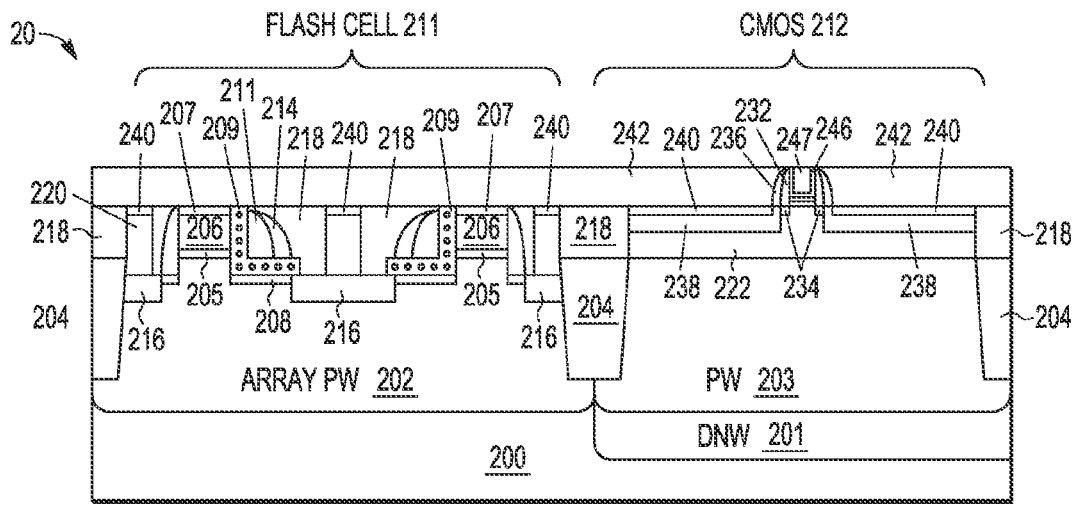

FIG. 20 illustrates processing of the semiconductor structure 20 subsequent to FIG. 19 after a replacement gate method is used to form metal gate electrodes 246-247 on the previously formed high-k gate dielectric layers 224, 226 in the gate electrode openings 244. As described herein, the metal gate electrodes may be formed with any desired technique, such as depositing one or more metal interface layers 246 in the gate electrode openings 244 (depending on the type of transistor being formed) to adjust the work function of the finally formed transistor, followed by depositing one or more conductive or metal gate layers 247 to fill the remainder of the gate electrode openings 244. However formed, the deposited metal interface and gate layers 246-247 may then be planarized with one or more planarization steps (e.g., a CMP step) to complete an inlaid or damascene fabrication sequence for forming the HKMG electrodes 246-247.

Figure 21:
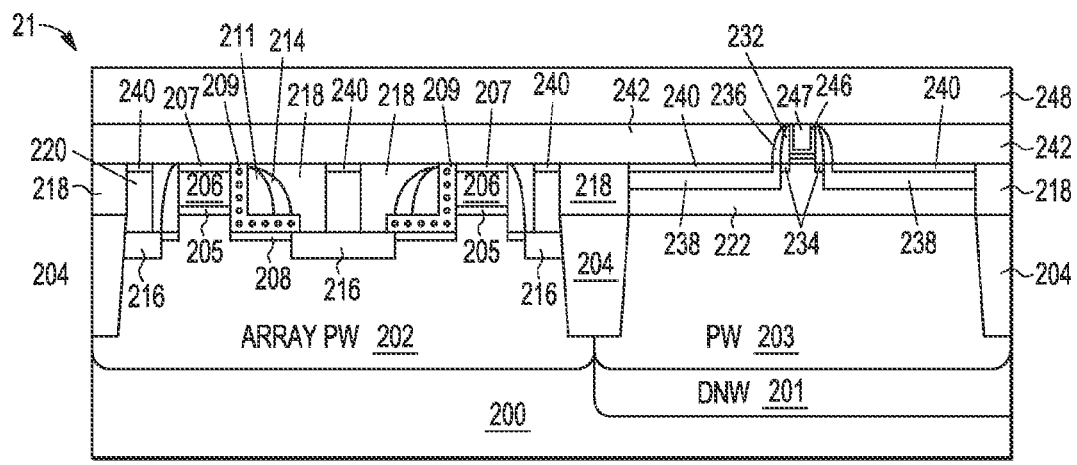

FIG. 21 illustrates processing of the semiconductor structure 21 subsequent to FIG. 20 after forming one or more planarized dielectric layers 248 over the planarized dielectric layer 242 to cover the HKMG electrodes 246-247. In selected example embodiments, the planarized dielectric layer 242 may be formed as part of a first interlayer dielectric layer or stack by depositing and polishing a dielectric layer 248 to have a predetermined thickness. In accordance with various embodiments, the planarized dielectric layer 248 is formed by depositing a conformal layer of silicon dioxide or other dielectric material using CVD, PECVD, PVD. ALD or any combination thereof.

Figure 22:
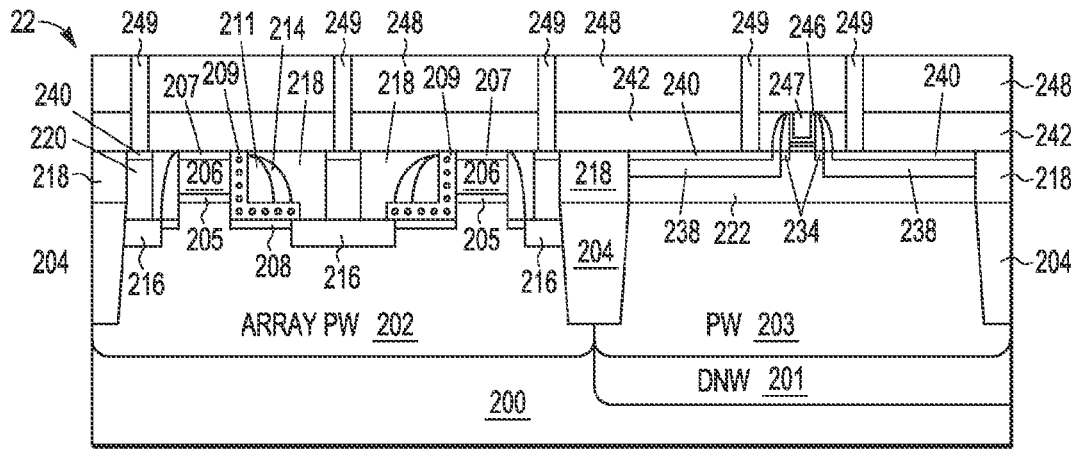

FIG. 22 illustrates processing of the semiconductor structure 22 subsequent to FIG. 21 after forming contacts 249 to the underlying flash memory cells and CMOS transistors through one or more planarized dielectric layers 242, 248. In selected example embodiments, the contacts 249 may be formed by forming a patterned mask or photoresist layer (not shown) with openings aligned over the silicided bitcell connection structures 220, 240 and over the silicided source/drain contact regions 238, 240, and over the metal gate electrodes 246-247 (not shown). Using the patterned photoresist/mask layer, the planarized dielectric layers 242, 248 are anisotropically etched to form openings which expose the silicided bitcell connection structures 220, 240, the silicided source/drain contact regions 238, 240, and the metal gate electrodes 246-247 (not shown). In the openings, conductive contact structures 249 are formed using any desired fabrication sequence, such as depositing one or more conductive layers to fill the openings, and then applying a CMP process to planarize the contacts 249 with the planarized dielectric layer 248.

Figure 23:
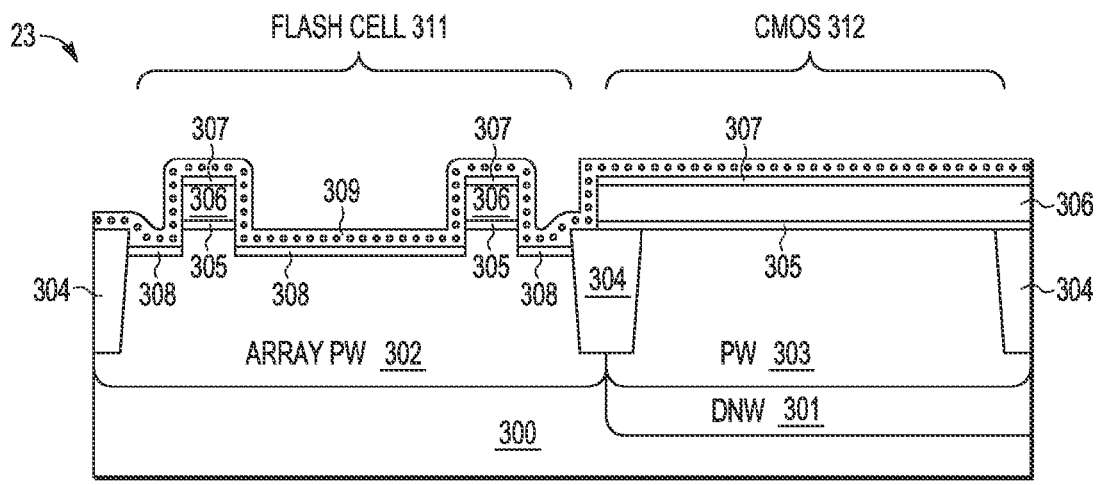
FIGS. 23-30 show a third example semiconductor device during successive phases of a fabrication sequence in which split-gate thin film storage non-volatile memory bitcells are fabricated before forming an elevated substrate area on which NMOS and PMOS high-k metal gate transistors are formed using a gate last process.

Turning now to FIGS. 23-30, there is shown a third example semiconductor device during successive phases of a fabrication sequence in which split-gate thin film storage non-volatile memory bitcells with polished control gates are fabricated before using selective silicon epitaxial growth to elevate substrate areas where a gate last process is used to form NMOS and PMOS high-k metal gate transistors. Starting with FIG. 23, there is shown a partial cross-sectional view of the third semiconductor device or structure 23 formed on a substrate 300 which includes an array substrate region 302 and logic substrate region 303 separated from one another by shallow trench isolation (STI) structures 304, and which may also include a deep well region 301 formed under the well region 303 to isolate the active substrate layers in the logic substrate region 303. As described hereinabove, the doping and polarity type of the various substrate regions 300-303 will depend on whether the transistor or bitcell devices formed therein are n-type or p-type devices. As illustrated in FIG. 23, one or more split-gate polysilicon nanocrystal TFS NVM bitcell structures are formed in the array substrate region 302 of the semiconductor structure 23 using any desired processing steps. For example, one or more patterned select gate electrodes 305-307 may be formed over a recessed control gate channel by sequentially growing or depositing one or more gate dielectric layers 305 (e.g., silicon dioxide), select gate conductor layers 306 (e.g., a doped poly layer), and capping dielectric layers 307 (e.g., silicon dioxide or nitride), and then patterning and anisotropically etching the resulting select gate stack to form the patterned select gate electrodes 305-307 for the TFS NVM bitcell structures. In selected embodiments, the select gate etch process includes a substrate recess etch process (e.g., reactive ion etch process) that is controlled to over-etch into the array substrate region 302, thereby recessing the control gate channel areas. After forming the patterned select gate electrodes 305-307 and recessed control gate channel areas, one or more doped control gate channel regions 308 may be selectively implanted into the recessed array substrate region 302 using conventional implanting processes to implant ions having a predetermined conductivity type, depending on the device type being formed. In addition, a conformal nanocrystal stack 309 may be formed over the semiconductor structure 23 using any desired nanocrystal stack formation sequence, thereby forming a polysilicon-nitrided-silicon dioxide (poly-SiON) stack 306-307, 309 to cover the recessed control gate channel areas and the top and sides of the select gate electrode stacks 305-307 formed over the army and logic substrate regions 302, 303.

Figure 24:
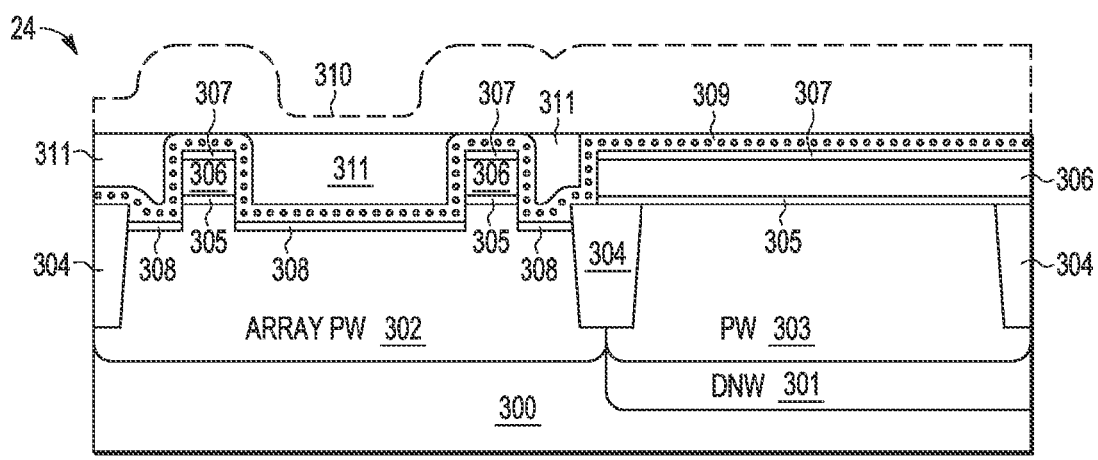

FIG. 24 illustrates processing of the semiconductor structure 24 subsequent to FIG. 23 after one of more control gate conductor layers 311 are formed over the nanocrystal stack 309, such as by blanket-depositing a polysilicon or SiGe layer 310 (shown with dashed lines) over the nanocrystal stack 309 using CVD, PECVD, PVD, ALD, or any combination(s) thereof to a predetermined thickness (e.g., approximately 500-2000 Angstroms), though other thicknesses of materials may be used. The control gate conductor layers 310 may be planarized (e.g., with a CMP step) and doped to form a conductive polished control gate 311 having a top surface that is substantially co-planar with the top of the nanocrystal stack 309.

Figure 25:
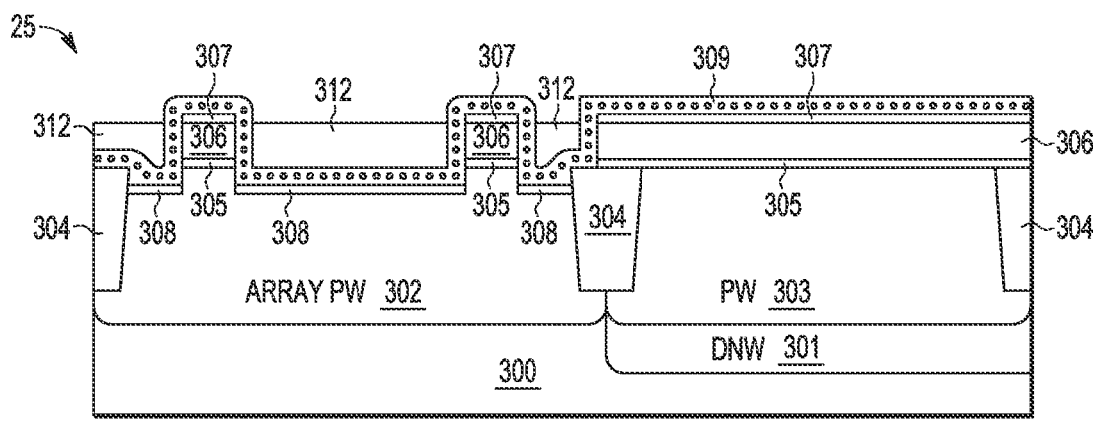

FIG. 25 illustrates processing of the semiconductor structure 25 subsequent to FIG. 24 after forming a recessed control gate layer 312 from the polished control gate 311. While any recess etch process may be used, the recessed control gate layer 312 may be formed by applying a reactive ion etch process to recess the polished control gate 311 without removing or substantially etching the nanocrystal stack 309. After the control gate recess etch sequence, recessed control gate layer 312 may have a top surface that is substantially co-planar with the top of the select gate conductor layer 306. After forming the recessed control gate layer 312, a patterned photoresist layer or etch mask 314 is formed to cover selected portions of the recessed control gate layer 312 and portions of the nanocrystal stack 309, while substantially leaving unprotected the portion of the nanocrystal stack 309 formed over the logic substrate region 303 where CMOS transistors are subsequently formed.

Figure 26:
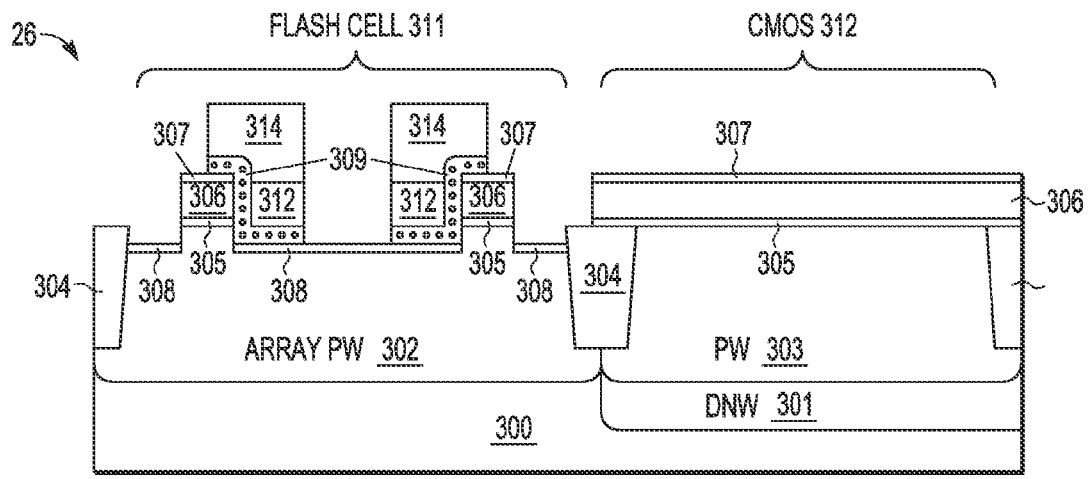

FIG. 26 illustrates processing of the semiconductor structure 26 subsequent to FIG. 25 after the patterned nanocrystal stack 309 and recessed control gate layer 312 are selectively etched to form split-gate electrodes around which implant spacers and source/drain implant regions are formed. In particular, unmasked portions of the recessed control gate layer 312 and underlying nanocrystal stack 309 may be anisotropically etched with the patterned photoresist layer or etch mask 314 in place to form split-gate TFS NVM bitcell gate electrode structures 305-307, 309, 311 using any desired etch sequence, including but not limited to patterned photoresist in combination with one or more anisotropic etch processes. As depicted, the etch process(es) used to selectively etch the nanocrystal stack 309 and unprotected portions of the recessed control gate layer 312 may be designed with a selective etch chemistry that removes any unmasked portions of the nanocrystal stack 309 and recessed control gate layer 312, while leaving substantially intact the underlying select gate conductor layers 306 and capping dielectric layers 307.

Figure 27:
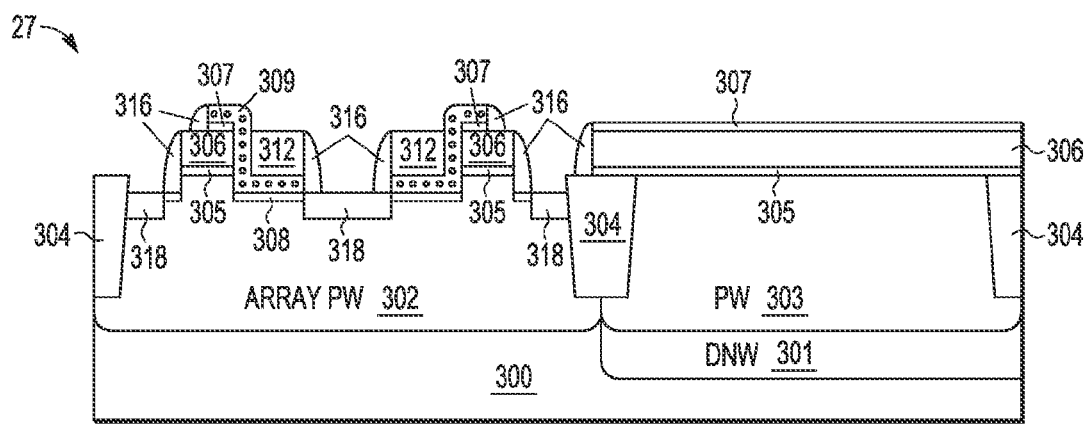

FIG. 27 illustrates processing of the semiconductor structure 27 subsequent to FIG. 26 after sidewall spacers 316 and source/drain regions 318 are formed in the array substrate region 302. After removing the patterned photoresist 314, the remaining patterned split-gate TFS NVM bitcell gate electrode structures may be used to form source/drain implant regions by forming one or more sidewall spacers 316 on the split-gate TFS NVM bitcell gate electrode structures, such as by growing or depositing one or more dielectric layers (e.g., silicon dioxide or nitride) which is then anisotropically etched to form the one or more sidewall spacers 316. Using the sidewall spacers 316 and patterned split-gate electrodes 305-307, 309, 312 in combination with one or more patterned implant masks (not shown), source/drain regions 318 may be formed by implanting appropriate polarity dopants, such as by implanting n-type or p-type halo or extension implant regions or deep N+/P+ source/drain regions. In other embodiments, the spacer and source/drain fabrication sequence may include formation of a first sidewall spacer for use in implanting halo implant regions, followed by formation of a second sidewall spacer adjacent to the first sidewall spacer for use in implanting deep source drain regions.

Figure 28:
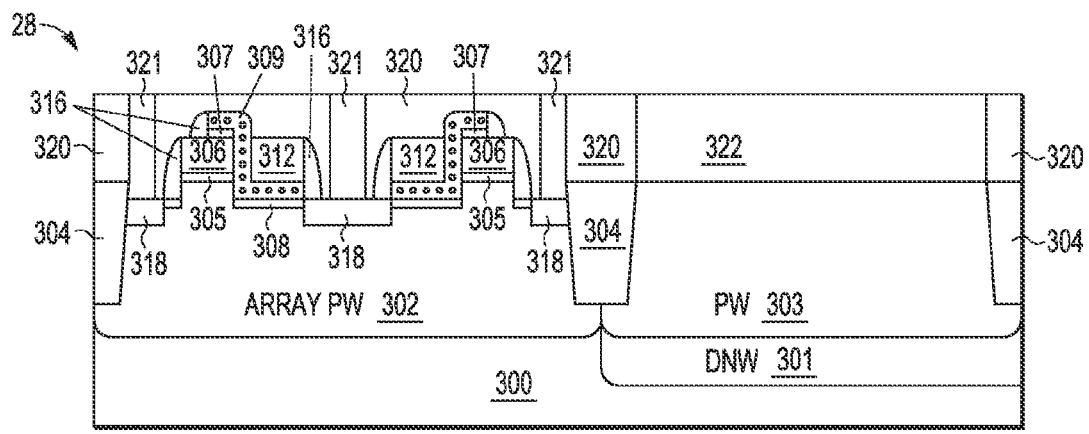

FIG. 28 illustrates processing of the semiconductor structure 28 subsequent to FIG. 27 after forming an elevated substrate 322 from the logic substrate region 303, alone or in combination with forming bitcell connection structures 321 from the array substrate region 302. As a preliminary step in forming the elevated substrate 322, the select gate conductor layers 306 and capping dielectric layers 307 are removed from above the logic substrate region 303 using one or more etch steps which may leave the gate dielectric layer(s) 305 in place. In addition, a planarized dielectric layer 320 is formed to cover the array and logic substrate regions 302, 303, such as by depositing and polishing a first interlayer dielectric layer or stack to a thickness that is greater than the height of the split-gate electrodes 305-307, 309, 312. At this point, the planarized dielectric layer 320 protects and isolates the poly layers 306, 312 in the split-gate electrodes 305-307, 309, 312. In the planarized dielectric layers 320, patterned openings are formed (e.g., with a patterned mask or photoresist layer and one or more anisotropic etch steps) to expose the source/drain contact regions 318 and over the logic substrate region 303. After removing any patterned mask or photoresist layer, epitaxial layers 321, 322 may be formed in the patterned openings, such as by using a selective epitaxial silicon growth process to fill the openings in the planarized dielectric layer 320. In this way, the epitaxial layer 330 forms an elevated substrate which has the same crystallographic orientation as the underlying logic substrate region 303. In selected embodiments, the epitaxial grown process is controlled to form an epitaxial layer 322 which is thicker than the height of the split-gate electrodes 305-307, 309, 312. To remove any overgrowth of the epitaxial semiconductor layer 322, a planarization or CMP polish step may be applied to planarize the epitaxial semiconductor layer 322 with the planarized dielectric layer 320.

Figure 29:
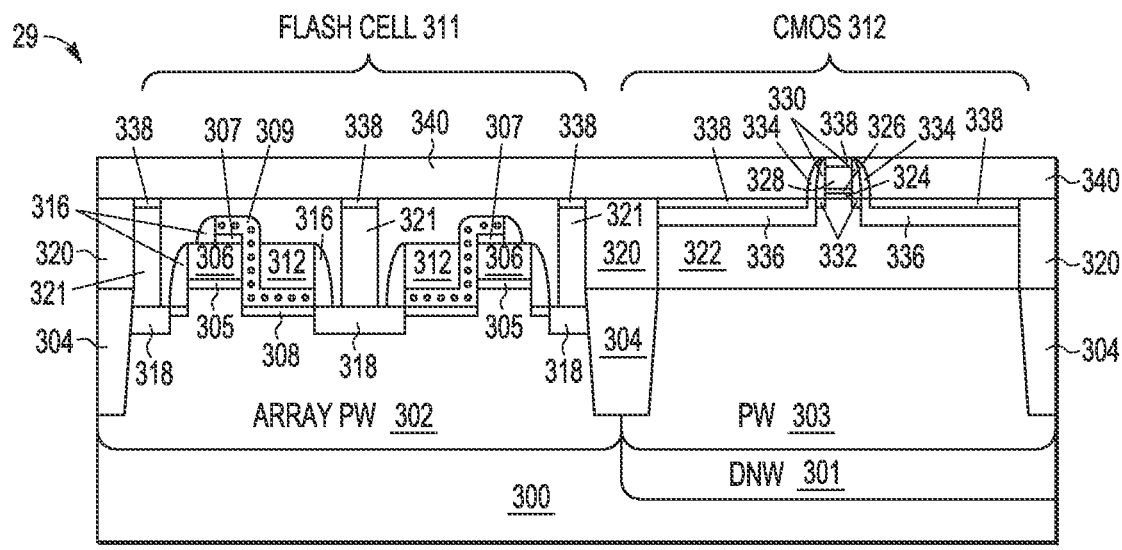

FIG. 29 illustrates processing of the semiconductor structure 29 subsequent to FIG. 28 after forming a sacrificial gate electrode 324, 326, 328 with sidewall spacers 330, 334 and source/drain regions 332, 336 on the elevated substrate 322 formed from the logic substrate region 303. After preparing the elevated substrate 322 with appropriate channel implants using implant masks and implantation steps to define the appropriate polarity implant regions (such as channel counter-doping or threshold voltage doping for any NMOS or PMOS low voltage transistors, dual gate transistors, high voltage transistors, or the like), one or more sacrificial transistor gate electrodes may be formed over the elevated substrate 322, such as by growing or depositing a base dielectric layer 324 (e.g. silicon dioxide or other suitable gate dielectric material) and a high-k dielectric layer 326 (e.g., $Hf_xSi_{1-x}O_y$) using CVD, PECVD, PVD, ALD, or any combination(s) of the above to a predetermined thickness. On the gate dielectric layers 324, 326, one of more gate conductor layers 328 may be formed, including a first deposited barrier metal layer (not shown) and a blanket-deposited conductive layer (e.g., polysilicon or SiGe) by CVD, PECVD. PVD, ALD, or any combination(s) thereof to a predetermined thickness. After forming a patterned etch mask or photoresist layer (not shown), the gate conductor layers(s) 328 and underlying gate dielectric layers 324, 326 may be anisotropically etched to form the sacrificial gate electrode 324, 326, 328 on the elevated substrate 322. On the sacrificial gate electrode 324, 326, 328, sidewall spacers 330, 334 are formed and used to form self-aligned silicide source/drain regions 332, 336 in the elevated substrate 322. For example, a first set of sidewall spacers 330 may be formed as implant masks by forming a first dielectric layer (e.g., depositing silicon dioxide or nitride) which is then anisotropically etched to form the sidewall spacers 330 on sidewalls of the sacrificial gate electrode 324, 326, 328 which are used in combination with one or more patterned implant masks (not shown) to form halo or extension implant regions 332 by implanting appropriate polarity dopants, such as n-type halo/extension regions for NMOS transistor devices or p-type halo/extension regions for PMOS transistor devices.

In addition, a second set of sidewall spacers 334 may subsequently be formed as implant masks by forming a second dielectric layer (e.g. depositing silicon dioxide or nitride) which is then anisotropically etched to form sidewall spacers 334 that are adjacent to the first sidewall spacers 330 and that are used in combination with one or more patterned implant masks (not shown) to implant deep source/drain implant regions 336 with appropriate polarity dopants, such as n-type source/drain regions for NMOS transistor devices or p-type source/drain regions for PMOS transistor devices. Subsequently, self-aligned silicide regions 338 may be formed in the exposed bitcell connection structures 321, source/drain regions 336, and gate conductor layers 328, such as by depositing and thermally annealing conductive or metal layer (e.g., cobalt or nickel) to react with the exposed semiconductor layers to form the silicide regions 338.

After forming the silicide regions 338, a planarized dielectric layer 340 is formed over the array and logic substrate regions 302, 303, and at least a portion of the sacrificial gate electrode 324, 326, 328 is removed. In selected embodiments, the planarized dielectric layer 340 may be formed as part of a first interlayer dielectric stack to cover the planarized dielectric layers 320 and bitcell connection structures 321 while exposing the top of the sacrificial gate electrode 324, 326, 328 by first depositing a dielectric layer using CVD, PECVD. PVD, or ALD to a predetermined thickness that is at least as thick as the height of the sacrificial gate electrode 324, 326, 328, and then planarizing the deposited dielectric layer with a CMP step to form a substantially planar dielectric layer 340. By using a timed CMP process, the planarized dielectric layer 340 exposes or partially removes the top of the sacrificial gate electrode 324, 326, 328.

Figure 30:
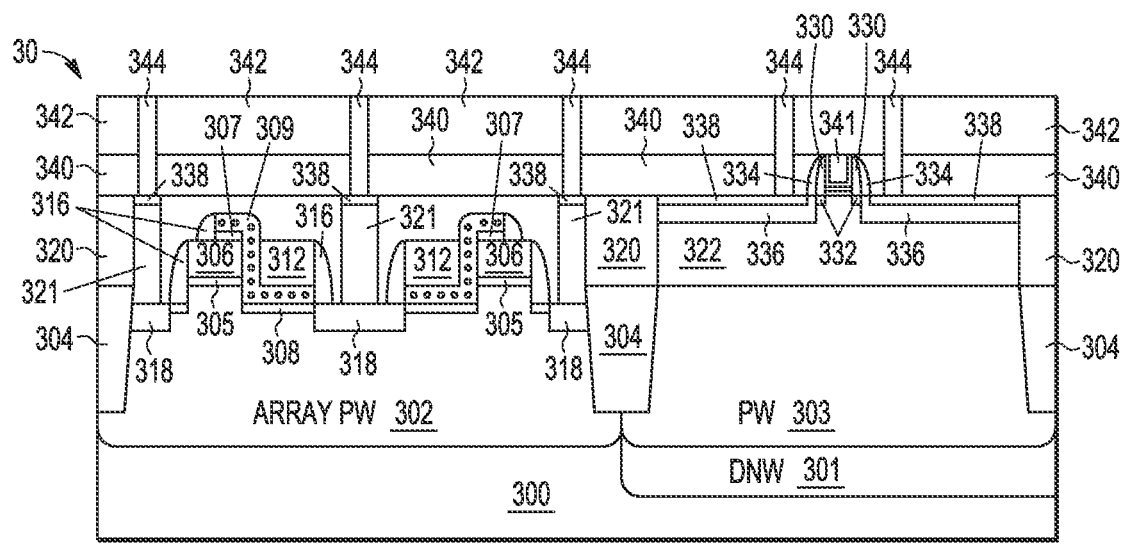

FIG. 30 illustrates processing of the semiconductor structure 30 subsequent to FIG. 29 after a replacement gate method is used to form metal gate electrodes 341 on the previously formed high-k gate dielectric layers 324, 326 along with contacts to the underlying device contact regions. As a preliminary step, all or part of the sacrificial gate electrodes 324, 326, 328 may be removed from the planarized dielectric layer 340 to form CMOS gate electrode openings therein by applying one or more etch processes to remove the constituent layers of the sacrificial gate electrode 324, 326, 328. At this juncture as the high-k metal gate formation processing begins, the presence of the planarized dielectric layer 242 over the split-gate electrodes 305-307, 309, 312 eliminates any processing requirements for forming a patterned mask layer to protect the poly control and select gates from the subsequent metal processing steps. In the CMOS gate electrode openings, metal gate electrodes 341 may be formed with any desired technique, such as depositing one or more metal interface layers in the gate electrode openings (depending on the type of transistor being formed) to adjust the work function of the finally formed transistor, followed by depositing one or more conductive or metal gate layers to fill the remainder of the gate electrode openings, and then polishing or planarizing the deposited metal interface and gate layers with one or more planarization steps (e.g., a CMP step) to complete an inlaid or damascene fabrication sequence for forming the HKMG electrodes 341. At this point, one or more additional planarized dielectric layers 342 may be formed over the planarized dielectric layer 340 to cover the HKMG electrodes 341, such as by depositing a first interlayer dielectric layer or stack which is then polished to a predetermined thickness. Thereafter, contacts 344 may be formed to the underlying flash memory cells and CMOS transistors through the planarized dielectric layers 340, 342, such as by forming a patterned mask or photoresist layer (not shown) with openings aligned over the silicided bitcell connection structures 321, 338 and over the silicided source/drain contact regions 336, 338, and over the metal gate electrodes 341 (not shown). Using the patterned photoresist/mask layer, the planarized dielectric layers 340, 342 are anisotropically etched to form openings which expose the silicided bitcell connection structures 321, 338, the silicided source/drain contact regions 336, 338, and the metal gate electrodes 341 (not shown). In the openings, conductive contact structures 344 are formed using any desired fabrication sequence, such as depositing one or more conductive layers to fill the openings, and then applying a CMP process to planarize the contacts 344 with the planarized dielectric layer 342.

Turning now to FIGS. 31-39, there is shown a fourth example semiconductor device during successive phases of a fabrication sequence in which split-gate thin film storage non-volatile memory bitcells with in-laid control gates are fabricated before using selective silicon epitaxial growth to elevate substrate areas where a gate last process is used to form NMOS and PMOS high-k metal gate transistors. Starting with FIG. 31, there is shown a partial cross-sectional view of the fourth semiconductor device or structure 31 formed on a substrate 400 in which an array substrate region 402 and logic substrate region 403 are formed and separated from one another by shallow trench isolation (STI) structures 404, alone or in combination with a deep well region 401 formed under the well region 403 to isolate the active substrate layers in the logic substrate region 403. As will be appreciated, the doping and polarity type of the various substrate regions 400-403 will the type of transistor or bitcell devices (e.g., n-type or p-type devices) formed therein. Over the array substrate region 402 of the semiconductor structure 31, one or more split-gate polysilicon nanocrystal TFS NVM bitcell structures are formed in using any desired processing steps. For example, one or more patterned select gate electrodes 405-407 may be formed over a recessed control gate channel by sequentially growing or depositing one or more gate dielectric layers 405 (e.g., silicon dioxide), select gate conductor layers 406 (e.g., a doped poly layer), and capping dielectric layers 407 (e.g., silicon dioxide or nitride), and then patterning and anisotropically etching the resulting select gate stack to form the patterned select gate electrodes 405-407, where the select gate etch process may include a substrate recess etch process (e.g., reactive ion etch process) that is controlled to over-etch into the array substrate region 402, thereby recessing the control gate channel areas. After forming the patterned select gate electrodes 405-407 and recessed control gate channel areas, a silicon oxide layer 408 may be thermally grown to repair the surface damage from the recess etch, and one or more doped control gate channel regions 409 may be selectively implanted into the recessed array substrate region 402 using conventional implanting processes to implant ions having a predetermined conductivity type, depending on the device type being formed. After doping the channel regions 409, a thin etch stop layer 410 may be formed over the patterned select gate electrodes 405-407, such as by depositing a thin nitride layer. In addition, a conformal dielectric layer 411 is formed over the semiconductor structure, such as by depositing a conformal oxide layer using CVD, PECVD, PVD, ALD, or any combination(s) thereof to a thickness that is sufficient to coat the top and sides of the patterned select gate electrodes 405-407 and to completely fill the spaces therebetween.

Figure 31:
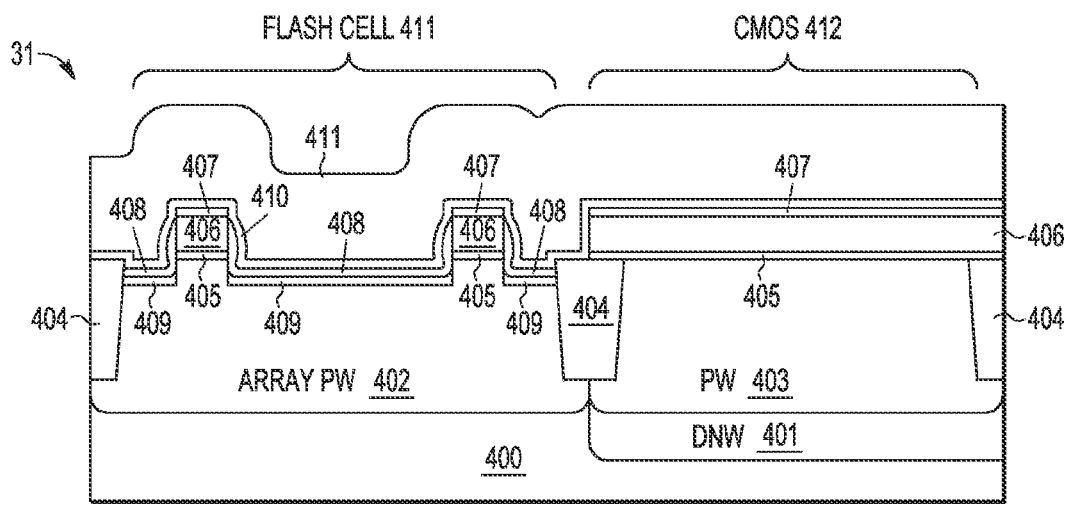
FIGS. 31-39 show a fourth example semiconductor device during successive phases of a fabrication sequence in which split-gate thin film storage non-volatile memory bitcells are fabricated before forming an elevated substrate area on which NMOS and PMOS high-k metal gate transistors are formed using a gate last process.
Figure 32:
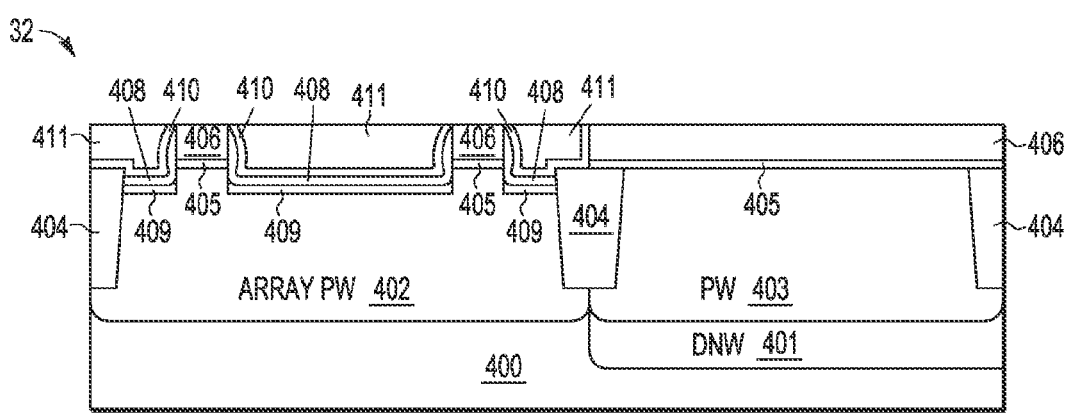

FIG. 32 illustrates processing of the semiconductor structure 32 subsequent to FIG. 31 after the conformal dielectric layer 411 is planarized or otherwise processed to remove the thin etch stop layer 410 and capping dielectric layers 407 removed from the top of the patterned select gate electrodes 405-407. In selected example embodiments, the planarized dielectric layer 411 may be formed with a CMP process which may be timed to expose or partially remove the top of the conformal dielectric layer 411 formed on top of the sacrificial gate electrode 405-407. If required, one or more additional etch processes, such as a dry etch process, may be applied to remove the thin etch stop layer 410 from the top (but not the sides) of the patterned select gate electrodes 405-407. In addition, the etch processing removes the capping dielectric layers 407, thereby forming a polished poly select gate layer 406.

Figure 33:
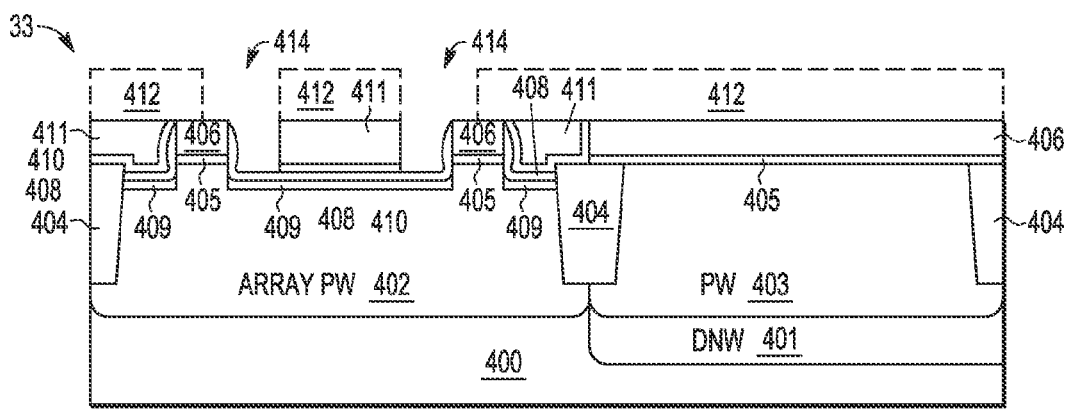

FIG. 33 illustrates processing of the semiconductor structure 33 subsequent to FIG. 32 after selectively etching the planarized dielectric layer 411 to form control gate trenches 414 adjacent to the polished poly select gate layer 406. While any selective etch process may be used, the control gate trenches 414 may be formed by patterning a photoresist layer or etch mask 412 to cover selected portions of the polished poly select gate layer 406 (including the portions over the logic substrate region 403) with openings formed over the intended control gate trenches 414 adjacent to the polished poly select gate layer 406. With the patterned photoresist layer or etch mask 412 in place, one or more etch processes may be applied to form the control gate trenches 414. For example, a first reactive ion etch process may be applied to etch unmasked portions of the planarized dielectric layer 411 down to the underlying etch stop layer 410. After stripping the patterned photoresist layer or etch mask 412, an additional wet etch process may be applied to remove any exposed etch stop layer 410, thereby exposing the underlying oxide layer 408 in the recessed control gate areas.

Figure 34:
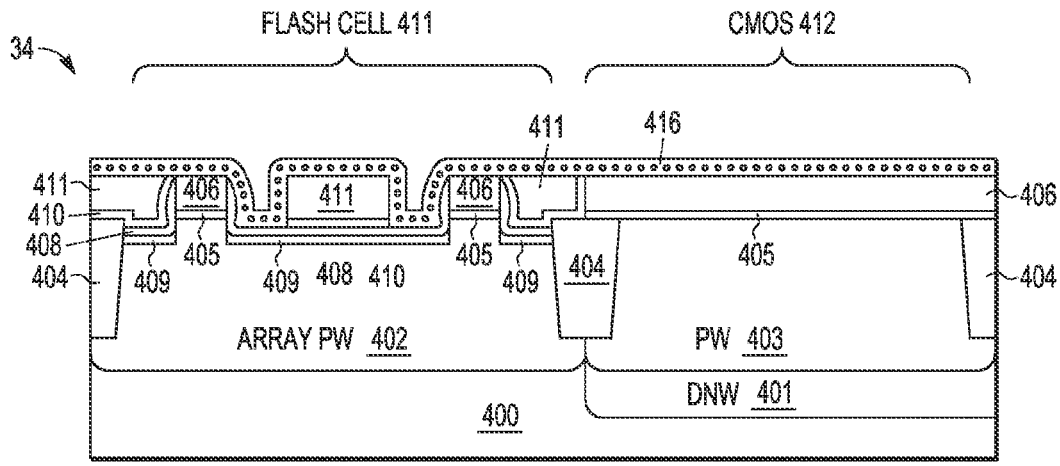

FIG. 34 illustrates processing of the semiconductor structure 34 subsequent to FIG. 33 after forming a nanocrystal stack 416 to cover the top and sides of the patterned select gate electrodes 405-406. While any desired nanocrystal stack formation sequence may be used, in selected embodiments, the conformal nanocrystal stack 416 may be formed over the semiconductor structure 34 by sequentially forming a bottom silicon oxide or other appropriate insulating layer to cover the top and sides of the patterned select gate electrodes 405-406. On the bottom silicon oxide layer, a layer of nanocrystals may be formed having predetermined diameters and spacing, followed by depositing a top silicon oxide layer with a low pressure chemical vapor deposition (LPCVD) high temperature oxide (HTO). In this way, a polysilicon-nitrided-silicon dioxide (poly-SiON) stack 406, 416 covers the recessed control gate channel areas and the top and sides of the patterned select gate electrodes 405-406 formed over the array and logic substrate regions 402, 403.

Figure 35:
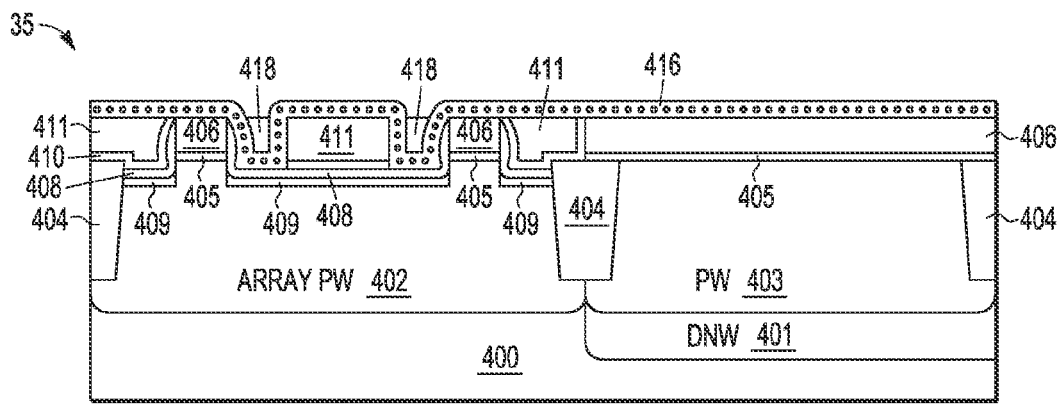

FIG. 35 illustrates processing of the semiconductor structure 35 subsequent to FIG. 34 after one of more recessed or in-laid control gate layers 418 are formed over the nanocrystal stack 416 and in the control gate trenches 414. While any desired control gate formation sequence may be used, in selected embodiments, the recessed control gates 418 may be formed by blanket-depositing a control gate layer (e.g. polysilicon or SiGe) over the nanocrystal stack 416 using CVD, PECVD, PVD, ALD, or any combination(s) thereof to a predetermined thickness that is sufficient to completely fill the control gate trenches 414. The control gate layer may then be planarized (e.g., with a CMP step) and doped to form a conductive polished control gate having a top surface that is substantially co-planar with the top of the nanocrystal stack 416. In addition, a recess etch process (e.g., a reactive ion etch process) may be applied to form the recessed control gate layers 418 by recessing the polished control gate without removing or substantially etching the nanocrystal stack 416. After the control gate recess etch sequence, recessed control gate layer 418 may have a top surface that is substantially co-planar with the top of the polished poly select gate layer 406. At any point, the recessed control gate layer 418 may be implanted or doped with impurities to make the recessed control gate layer 418 conductive.

Figure 36:
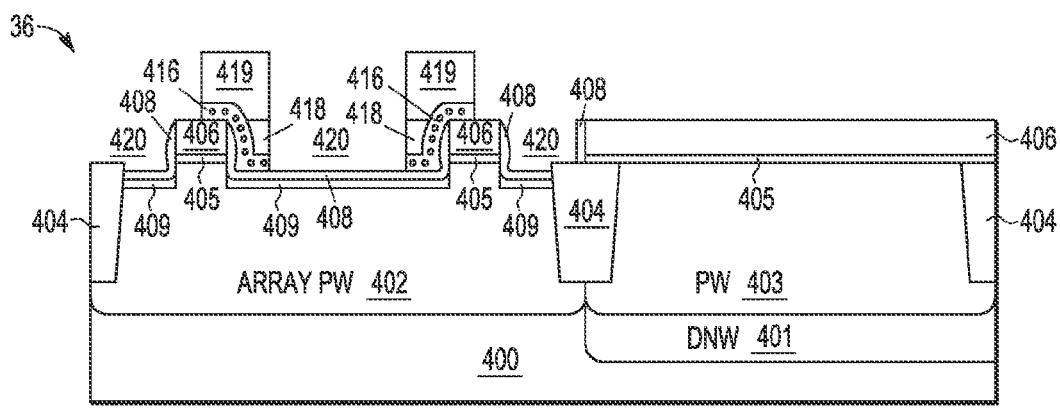

FIG. 36 illustrates processing of the semiconductor structure 36 subsequent to FIG. 35 after the nanocrystal stack 416 and planarized dielectric layer 411 are selectively etched to form split-gate electrodes from the polished poly select gate layer 406, unetched nanocrystal stack 416, and recessed or in-laid control gate layers 418. While any desired selective etch process may be used, in selected embodiments, the split-gate electrodes may be formed by patterning a photoresist layer or etch mask 419 to cover the recessed control gate layer 418 and selected portions of the polished poly select gate layer 406 and nanocrystal stack 416, while substantially leaving unprotected the portion of the nanocrystal stack 416 formed over the logic substrate region 403 where CMOS transistors are subsequently formed. With the patterned photoresist/mask 419 in place, the planarized dielectric layer 411 and unprotected portions of the nanocrystal stack 416 may be anisotropically etched down to the etch stop layer 410 using any desired etch sequence, including but not limited to oxide etch and/or nanocrystal etch process. After stripping the patterned photoresist/mask 419, an etch process (e.g., wet nitride etch) may be applied to remove the etch stop layer 410. As depicted, the etch process(es) may be designed with a selective etch chemistry that removes any unmasked portions of the nanocrystal stack 416, planarized dielectric layer 411, and etch stop layer 410, while leaving substantially intact the polished poly select gate layer 406 and the recessed or in-laid control gate layers 418. The choice of dielectric type for layers 408 and 410 may be made so that layer 408 provides a stopping layer when layer 410 is etched.

Figure 37:
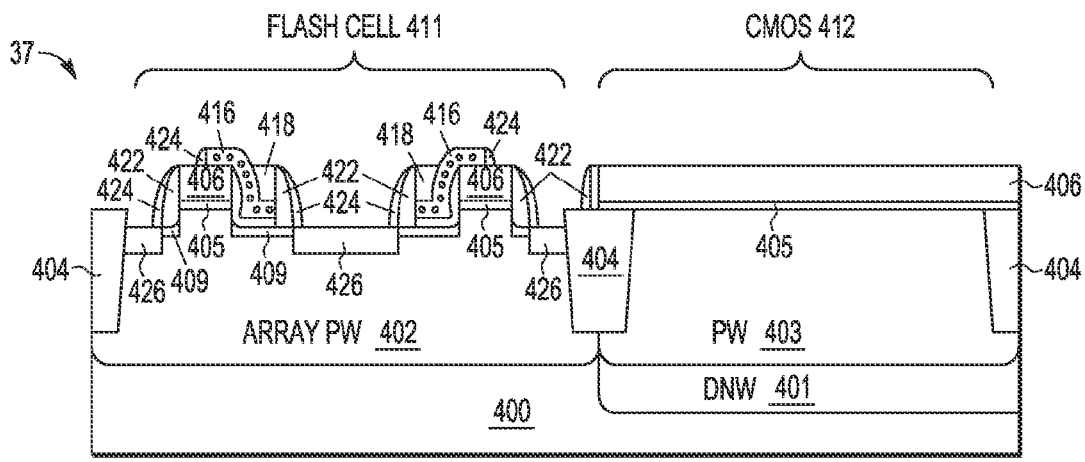

FIG. 37 illustrates processing of the semiconductor structure 37 subsequent to FIG. 36 after implant spacers and source/drain implant regions 426 are formed around the split-gate electrodes 406, 408, 418. In an example sequence, one or more sidewall spacers 422, 424 are formed on the split-gate electrodes 406, 408, 418, such as by growing or depositing one or more dielectric layers (e.g., silicon dioxide or nitride) which is then anisotropically etched to form the one or more sidewall spacers 422, 424. Using the sidewall spacers 422, 424 and split-gate electrodes 406, 408, 418 in combination with one or more patterned implant masks (not shown), source/drain regions 426 may be formed by implanting appropriate polarity dopants, such as by implanting n-type or p-type halo or extension implant regions or deep N+/P+ source/drain regions. In other embodiments, the spacer and source/drain fabrication sequence may include formation of a first sidewall spacer 422 for use in implanting halo implant regions, followed by formation of a second sidewall spacer 424 adjacent to the first sidewall spacer 422 for use in implanting deep source/drain regions 426.

Figure 38:
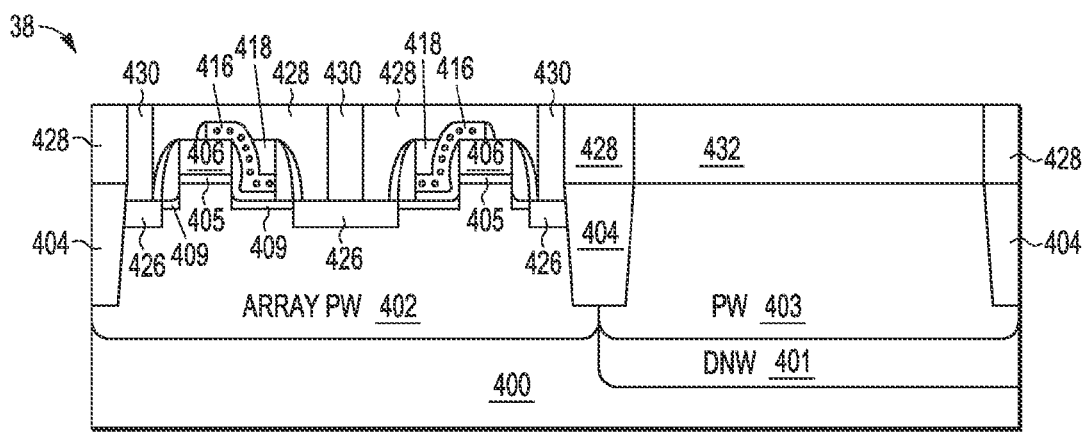

FIG. 38 illustrates processing of the semiconductor structure 38 subsequent to FIG. 37 after forming an elevated substrate 432 from the logic substrate region 403, alone or in combination with forming bitcell connection structures 430 from the array substrate region 402. As a preliminary step in forming the elevated substrate 432, the polished select gate conductor layers 406 are removed from above the logic substrate region 403 using one or more etch steps which may leave the gate dielectric layer(s) 405 in place. In addition, a planarized dielectric layer 428 is formed to cover the array and logic substrate regions 402, 403, such as by depositing and polishing a first interlayer dielectric layer or stack to a thickness that is greater than the height of the split-gate electrodes 406, 408, 418. At this point, the planarized dielectric layer 428 protects and isolates the polished poly select gate layer 406 and recessed or in-laid control gate layers 418. In the planarized dielectric layers 428, patterned openings are formed (e.g., with a patterned mask or photoresist layer and one or more anisotropic etch steps) to expose the source/drain contact regions 426 and over the logic substrate region 403. After removing any patterned mask or photoresist layer, epitaxial layers 430, 432 may be formed in the patterned openings, such as by using a selective epitaxial silicon growth process to fill the openings in the planarized dielectric layer 428. In this way, the epitaxial layer 432 forms an elevated substrate which has the same crystallographic orientation as the underlying logic substrate region 403. In selected embodiments, the epitaxial grown process is controlled to form an epitaxial layer 432 having a thickness (e.g., approximately 500-1500 Angstroms) which is thicker than the height of the split-gate electrodes 406, 408, 418. To remove any overgrowth of the epitaxial semiconductor layer 430, 432, a planarization or CMP polish step may be applied to planarize the epitaxial semiconductor layer 430, 432 with the planarized dielectric layer 428.

Figure 39:
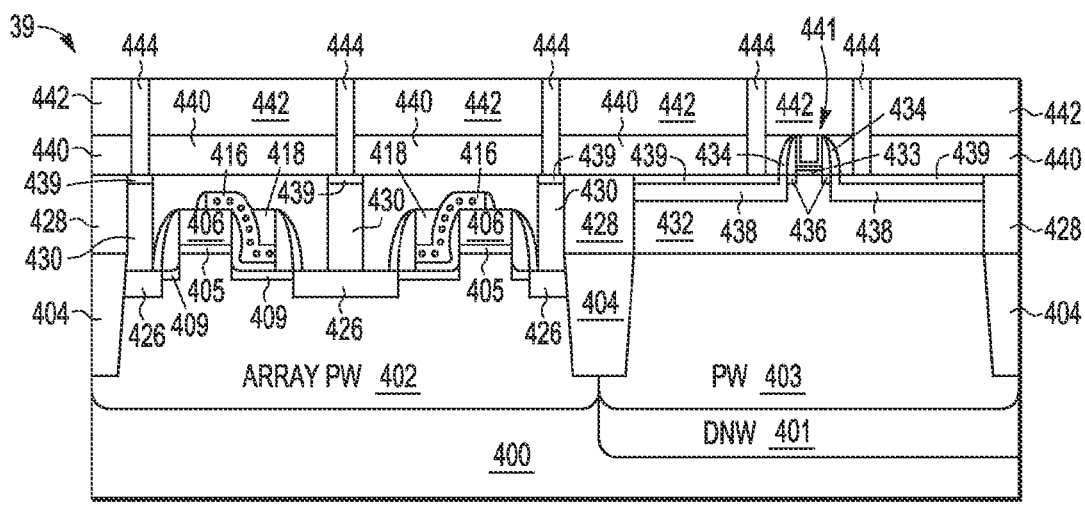

FIG. 39 illustrates processing of the semiconductor structure 39 subsequent to FIG. 38 after a replacement gate method is used to form metal gate electrodes 441 with one or more high-k gate dielectric layers 433 and associated source/drain regions 436, 438 along with contacts 444 through one or more dielectric layers 440, 442 to the underlying silicided device contact regions 428. In selected embodiments of the replacement gate method, the elevated substrate 432 is prepared with appropriate channel implants using implant masks and implantation steps to define the appropriate polarity implant regions (such as channel counter-doping or threshold voltage doping for any NMOS or PMOS low voltage transistors, dual gate transistors, high voltage transistors, or the like). On the elevated substrate 432, a sacrificial gate electrode is formed by patterning a conductive gate electrode layer (e.g., poly or SiGe and a barrier metal layer) (not shown) over one or more high-k gate dielectric layers 433 which are formed on the elevated substrate 432 by growing or depositing a base dielectric layer (e.g., silicon dioxide or other suitable gate dielectric material) and a high-k dielectric layer (e.g., $Hf_xSi_{1-x}O_y$) using CVD, PECVD, PVD, ALD, or any combination(s) of the above. On the patterned conductive gate electrode layer, sidewall spacers 434 are formed and used to form self-aligned silicide source/drain regions 438, 439 in the elevated substrate 432. For example, a first set of sidewall spacers 434 may be formed as implant masks by forming a first dielectric layer (e.g., depositing silicon dioxide or nitride) which is then anisotropically etched to form the sidewall spacers 434 on sidewalls of the patterned conductive gate electrode layer which are used in combination with one or more patterned implant masks (not shown) to form halo or extension implant regions 436, 438 by implanting appropriate polarity dopants, such as n-type halo/extension regions 436 or deep N+ source/drain regions 438 for NMOS transistor devices or p-type halo/extension regions 436 or deep P+ source/drain regions 438 for PMOS transistor devices. Subsequently, self-aligned silicide regions 439 may be formed in the exposed bitcell connection structures 430 and source/drain regions 438, such as by depositing and thermally annealing conductive or metal layer (e.g. cobalt or nickel) to react with the exposed semiconductor layers to form the silicide regions 439.

After forming the silicide regions 439, a planarized dielectric layer 440 is formed over the array and logic substrate regions 402, 403, and at least a portion of the sacrificial gate electrode is removed. In selected embodiments, the planarized dielectric layer 440 may be formed as part of a first interlayer dielectric stack to cover the planarized dielectric layers 428 and bitcell connection structures 432 while exposing the top of the sacrificial gate electrode by first depositing a dielectric layer using CVD. PECVD, PVD, or ALD to a predetermined thickness that is at least as thick as the height of the sacrificial gate electrode, and then planarizing the deposited dielectric layer with a CMP step to form a substantially planar dielectric layer 440. By using a timed CMP process, the planarized dielectric layer 440 exposes or partially removes the top of the sacrificial gate electrode. At this point in the replacement gate method, all or part of the sacrificial gate electrode may be removed from the planarized dielectric layer 440 to form CMOS gate electrode openings therein, such as by applying one or more etch processes to remove one or more of the constituent layers of the sacrificial gate electrode. At this juncture as the high-k metal gate formation processing begins, the presence of the planarized dielectric layer 440 over the split-gate electrodes 406, 408, 418 eliminates any processing requirements for forming a patterned mask layer to protect the poly control and select gates from the subsequent metal processing steps. In the CMOS gate electrode openings, metal gate electrodes 441 may be formed with any desired technique, such as depositing one or more metal interface layers in the gate electrode openings (depending on the type of transistor being formed) to adjust the work function of the finally formed transistor, followed by depositing one or more conductive or metal gate layers to fill the remainder of the gate electrode openings, and then polishing or planarizing the deposited metal interface and gate layers with one or more planarization steps (e.g., a CMP step) to complete an inlaid or damascene fabrication sequence for forming the HKMG electrodes 441. At this point, one or more additional planarized dielectric layers 442 may be formed over the planarized dielectric layer 440 to cover the HKMG electrodes 341, such as by depositing a first interlayer dielectric layer or stack which is then polished to a predetermined thickness. Thereafter, contacts 444 may be formed to the underlying flash memory cells and CMOS transistors through the planarized dielectric layers 442, 440, such as by forming a patterned mask or photoresist layer (not shown) with openings aligned over the silicided bitcell connection structures 430, 439 and over the silicided source/drain contact regions 438, 439, and over the metal gate electrodes 441 (not shown). Using the patterned photoresist/mask layer, the planarized dielectric layers 442, 440 are anisotropically etched to form openings which expose the silicided bitcell connection structures 430, 439, the silicided source/drain contact regions 438, 439, and the metal gate electrodes 441 (not shown). In the openings, conductive contact structures 444 are formed using any desired fabrication sequence, such as depositing one or more conductive layers to fill the openings, and then applying a CMP process to planarize the contacts 444 with the planarized dielectric layer 442.

By now it should be appreciated that there is provided herein a semiconductor fabrication process for embedding non-volatile memory devices in an HKMG CMOS process. In the disclosed process, nonvolatile memory (NVM) cell gate structures are formed over one or more first substrate areas of a wafer, where each NVM cell gate structure includes one or more polysilicon layers. In selected embodiments, the NVM cell gate structures are formed as split-gate thin film storage bitcells which include a polysilicon control gate formed on a nanocrystal layer to at least partially overlap a polysilicon select gate, or a spacer control gate and a nanocrystal layer formed adjacent to a sidewall of a polysilicon select gate, or a polished and recessed control gate formed adjacent to a charge storage layer having a plurality of discrete storage elements, where the charge storage layer separates the polished and recessed control gate from an adjacent polysilicon select gate, or an in-laid control gate formed adjacent to a nanocrystal layer which separates the in-laid control gate from an adjacent polysilicon select gate. To protect at least the polysilicon layer(s) in each NVM cell gate structure, a first dielectric layer is formed over the wafer, such as by depositing a conformal oxide layer over the wafer to cover the NVM cell gate structures, and then planarizing the conformal oxide layer with a CMP process to form a substantially flat upper surface. In one or more openings formed in the first dielectric layer, an elevated substrate is epitaxially grown over one or more second substrate areas of the wafer, such as by patterning one or more openings in the first dielectric layer to expose one or more second substrate areas of the wafer while leaving other portions of the first dielectric layer over the NVM cell gate structures, followed by selectively growing an epitaxial semiconductor layer in the one or more openings in the first dielectric layer and then polishing the epitaxial semiconductor layer to form the elevated substrate having an elevated substrate surface which is at least as high as a top surface of the NVM cell gate structures. Over the elevated substrate, sacrificial transistor gate structures are formed while protecting the one or more polysilicon layers in each NVM cell gate structure with the first dielectric layer. In selected embodiments, the sacrificial transistor gate structures may be formed by depositing one or more high-k dielectric layers over the elevated substrate using a dielectric material which has a dielectric constant value of 7.0 or greater while protecting the one or more polysilicon layers in each NVM cell gate structure; depositing one or more polysilicon gate electrode layers over the one or more high-k dielectric layers while protecting the one or more polysilicon layers in each NVM cell gate structure; and patterning and etching the one or more polysilicon gate electrode layers and one or more high-k dielectric layers formed over the elevated substrate to form the sacrificial transistor gate structures. Subsequently, a second dielectric layer is formed on the first dielectric layer, where the second dielectric layer has a substantially flat upper surface which is coplanar with an expose upper surface of the sacrificial transistor gate structures. By selectively removing at least part of the sacrificial transistor gate structures, gate electrode openings are formed in the second dielectric layer without removing the NVM cell gate structures. In selected embodiments, the selectively removal step includes applying one or more poly etch processes to remove one or more polysilicon layers from the sacrificial transistor gate structures without removing the one or more polysilicon layers from the NVM cell gate structures. In other embodiments, parts of the sacrificial transistor gate structures are selectively removed by applying one or more poly etch processes to remove the polysilicon gate electrode layers to expose an underlying high-k gate dielectric layer in the gate electrode openings in the second dielectric layer. In the gate electrode openings, high-k metal gate electrodes are formed which are elevated above the NVM cell gate structures. In selected embodiments, the high-k metal gate electrodes are formed by forming a metal layer in the gate electrode openings, and then polishing the metal layer down to be substantially coplanar with the second dielectric layer to define the high-k metal gate electrodes which are elevated above the NVM cell gate structures. In other embodiments, the high-k metal gate electrodes are formed by depositing a first metal interface layer in the gate electrode openings to cover an underlying high-k dielectric layer; depositing one or more metal gate electrode layers in the gate electrode openings to cover the first metal interface layer; and applying one or more polish and/or etch steps to form planarized high-k metal-gate electrodes that are substantially coplanar with the second dielectric layer.

In another form, there is disclosed a semiconductor device and associated method of forming same. In the disclosed methodology and device, there is provided a wafer having a first wafer surface in a defined logic region and a second wafer surface in a defined non-volatile memory region. On the wafer, a dielectric-capped select gate electrode and dielectric-capped protective stack are formed, respectively, over the defined non-volatile memory region and the defined logic region. In selected embodiments, the dielectric-capped select gate electrode and dielectric-capped protective stack may be formed by forming a first dielectric layer on the first and second surfaces of the wafer; forming a first polysilicon layer on the first dielectric layer; forming a second dielectric layer on the first polysilicon layer; and patterning the second dielectric layer, first polysilicon layer, and first dielectric layer to define one or more dielectric-capped select gate electrodes over the defined non-volatile memory region and to define a dielectric-capped protective stack over the defined logic region. In addition, a non-volatile memory cell is formed from the dielectric-capped select gate electrode, where the NVM cell includes a control gate and one or more source/drain regions in the defined non-volatile memory region of the wafer that are adjacent to the dielectric-capped select gate electrode. In selected embodiments, the NVM cells are formed as split-gate thin film storage bitcells which each include a polysilicon control gate formed on a charge storage layer having a plurality of discrete storage elements to at least partially overlap the dielectric-capped select gate electrode. After forming the NVM cell, the dielectric-capped protective stack is removed from the defined logic region, such as by applying one or more etch processes to remove the dielectric-capped protective stack to expose the second surface of the wafer in the defined logic region. With the dielectric-capped protective stack removed, the second surface of the wafer is selectively elevated in the defined logic region and the one or more source/drain regions are selectively elevated in the defined non-volatile memory region above the non-volatile memory cell. In selected embodiments, the selective elevation process may be implemented by forming a patterned protective dielectric layer over the wafer to protect the dielectric-capped select gate electrode and control gate of the non-volatile memory cell, where the patterned protective dielectric layer includes an opening that exposes at least part of the second surface in the defined non-volatile memory region in which an elevated second surface may be epitaxially grown from an exposed part of the second surface. In other embodiments, the second surface of the wafer is selectively elevated by growing a semiconductor substrate layer from the second surface in a defined non-volatile memory region to have an elevated second surface in the defined logic region which is elevated above the control gate of the non-volatile memory cell. On the elevated second surface of the wafer, one or more metal logic gates are formed in the defined logic region using a replacement gate process. For example, the replacement gate process may include forming one or more sacrificial transistor gate electrodes over the elevated second surface of the wafer while protecting the dielectric-capped select gate electrode and control gate of the non-volatile memory cell with one or more protective dielectric layers. Over the sacrificial transistor gate electrode(s), a planarized dielectric layer may be formed which exposes an upper surface of the one or more sacrificial transistor gate electrodes so that at least part of the one or more sacrificial transistor gate electrodes may be selective removed to form one or more gate electrode openings in the planarized dielectric layer. In each gate electrode opening, a high-k metal gate electrode may be formed.

In yet another form, there is provided a semiconductor device with integrated logic and non-volatile memory cells and associated method for fabricating same. As disclosed, the semiconductor device includes a semiconductor substrate which has a first lower substrate surface in a defined non-volatile memory region and a second elevated epitaxial substrate surface in a defined logic region. The semiconductor device also includes one or more non-volatile polysilicon discrete storage element bitcells formed on the first lower substrate surface, each of which includes a select gate electrode, a nanocrystal stack layer, and a control gate. The semiconductor device also includes one or more high-k metal gate logic transistors formed on the second elevated epitaxial substrate surface using a replacement gate process, where the second elevated epitaxial substrate surface is elevated above the select gate electrode, a nanocrystal stack layer, and a control gate of the one or more non-volatile polysilicon nanocrystal thin film storage bitcells.

Although selected embodiments use a split-gate NVM cell with a storage layer containing silicon nanoclusters or nanocrystals, any desired NVM cell structures may also be used since the formation of the gates of any CMOS transistor gates on the elevated substrate eliminates any requirement that the height of the gates for the NVM cells be the same as the height of the CMOS transistor gates. Examples of alternative NVM cells include a split-gate cell utilizing a nitride storage layer, and a one-transistor NVM cell utilizing nitride storage (also known as a SONOS NVM cell), and the like.

Although the described exemplary embodiments disclosed herein are directed to various semiconductor device structures and methods for making same using an integrated poly/HKMG process, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various poly gate electrode devices are illustrated as being split-gate flash memory devices, this is merely for convenience of explanation and not intended to be limiting and persons of skill in the art will understand that the principles taught herein apply to devices of either conductivity type. Accordingly, other types of poly gate devices may be formed on-chip with metal-gate electrodes as disclosed herein. Moreover, the thicknesses and doping concentrations of the described layers may deviate from the disclosed ranges or values. In addition, the terms of relative position used in the description and the claims, if any, are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process comprising:
    forming a plurality of nonvolatile memory cell gate structures over one or more first substrate areas of a wafer, each nonvolatile memory cell gate structure comprising one or more polysilicon layers;
    forming a first dielectric layer over the wafer to protect at least the one or more polysilicon layers in each nonvolatile memory cell gate structure;
    epitaxially growing an elevated substrate in one or more openings formed in the first dielectric layer over one or more second substrate areas of the wafer;
    forming a plurality of sacrificial transistor gate structures over the elevated substrate while protecting the one or more polysilicon layers in each nonvolatile memory cell gate structure with the first dielectric layer;
    forming a second dielectric layer on the first dielectric layer, where the second dielectric layer has a substantially flat upper surface which exposes an upper surface of the plurality of sacrificial transistor gate structures;
    selectively removing at least part of the plurality of sacrificial transistor gate structures to form a plurality of gate electrode openings in the second dielectric layer without removing the plurality of non-volatile memory cell gate structures;
    forming a plurality of high-k metal gate electrodes in the plurality of gate electrode openings which are elevated above the plurality of nonvolatile memory cell gate structures.

2. The semiconductor fabrication process of claim 1, where forming the plurality of nonvolatile memory cell gate structures comprises forming a plurality of split-gate bitcells, each comprising a polysilicon control gate formed on a nanocrystal layer that at least partially overlaps a polysilicon select gate.

3. The semiconductor fabrication process of claim 1, where forming the plurality of nonvolatile memory cell gate structures comprises forming a plurality of split-gate bitcells, each comprising a spacer control gate and a nanocrystal layer formed adjacent to a sidewall of a polysilicon select gate.

4. The semiconductor fabrication process of claim 1, where forming the plurality of nonvolatile memory cell gate structures comprises forming a plurality of split-gate bitcells, each comprising a polished and recessed control gate formed adjacent to a charge storage layer comprising a plurality of discrete storage elements, where the charge storage layer separates the polished and recessed control gate from an adjacent polysilicon select gate.

5. The semiconductor fabrication process of claim 1, where forming the plurality of nonvolatile memory cell gate structures comprises forming a plurality of split-gate bitcells, each comprising an in-laid control gate formed adjacent to a nanocrystal layer which separates the in-laid control gate from an adjacent polysilicon select gate.

6. The semiconductor fabrication process of claim 1, where forming the first dielectric layer comprises:
    depositing a conformal oxide layer over the wafer to cover the plurality of non-volatile memory cell gate structures, and
    planarizing the conformal oxide layer with a chemical mechanical polish process to form a substantially flat upper surface to protect at least the one or more polysilicon layers in each nonvolatile memory cell gate structure.

7. The semiconductor fabrication process of claim 1, where epitaxially growing the elevated substrate comprises:
    patterning one or more openings in the first dielectric layer to expose one or more second substrate areas of the wafer while leaving other portions of the first dielectric layer over the plurality of nonvolatile memory cell gate structures;
    selectively growing an epitaxial semiconductor layer in the one or more openings in the first dielectric layer, and
    polishing the epitaxial semiconductor layer to form the elevated substrate having an elevated substrate surface which is at least as high as a top surface of the plurality of nonvolatile memory cell gate structures.

8. The semiconductor fabrication process of claim 1, where forming the plurality of high-k metal gate electrodes comprises:
    forming a metal layer in the plurality of gate electrode openings; and
    polishing the metal layer down to be substantially coplanar with the second dielectric layer to define the plurality of high-k metal gate electrodes which are elevated above the plurality of nonvolatile memory cell gate structures.

9. The semiconductor fabrication process of claim 1, where selectively removing at least part of the plurality of sacrificial transistor gate structures comprises:
    applying one or more poly etch processes to remove one or more polysilicon layers from the plurality of sacrificial transistor gate structures without removing the one or more polysilicon layers from the plurality of non-volatile memory cell gate structures.

10. The semiconductor fabrication process of claim 1, where forming the plurality of sacrificial transistor gate structures comprises:
    forming one or more high-k dielectric layers over the elevated substrate using a dielectric material which has a dielectric constant value of 7.0 or greater while protecting the one or more polysilicon layers in each nonvolatile memory cell gate structure;
    depositing one or more polysilicon gate electrode layers over the one or more high-k dielectric layers while protecting the one or more polysilicon layers in each nonvolatile memory cell gate structure; and
    patterning and etching the one or more polysilicon gate electrode layers and one or more high-k dielectric layers formed over the elevated substrate to form the plurality of sacrificial transistor gate structures.

11. The semiconductor fabrication process of claim 10, where selectively removing at least part of the plurality of sacrificial transistor gate structures comprises applying one or more poly etch processes to remove the one or more polysilicon gate electrode layers to expose an underlying high-k gate dielectric layer in the plurality of gate electrode openings in the second dielectric layer.

12. The semiconductor fabrication process of claim 11, where forming the plurality of high-k metal gate electrodes comprises:
- depositing a first metal interface layer in the plurality of gate electrode openings to cover an underlying high-k dielectric layer;
- depositing one or more metal gate electrode layers in the plurality of gate electrode openings to cover the first metal interface layer; and
- applying one or more polish and/or etch steps to form a plurality of planarized high-k metal-gate electrodes that are substantially coplanar with the second dielectric layer.

* * * * *